United States Patent
Firouzdor et al.

(10) Patent No.: US 10,745,805 B2
(45) Date of Patent: Aug. 18, 2020

(54) PLASMA RESISTANT COATING OF POROUS BODY BY ATOMIC LAYER DEPOSITION

(71) Applicant: Applied Materials, Inc., Santa Clara, CA (US)

(72) Inventors: Vahid Firouzdor, San Mateo, CA (US); Sumanth Banda, San Jose, CA (US); Rajinder Dhindsa, Santa Clara, CA (US); Daniel Byun, Campbell, CA (US); Dana Marie Lovell, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 15/849,277

(22) Filed: Dec. 20, 2017

(65) Prior Publication Data

US 2018/0265973 A1    Sep. 20, 2018

Related U.S. Application Data

(63) Continuation of application No. 15/462,718, filed on Mar. 17, 2017.

(51) Int. Cl.
*B32B 9/00* (2006.01)
*C23C 16/455* (2006.01)
(Continued)

(52) U.S. Cl.
CPC ...... *C23C 16/45527* (2013.01); *C23C 16/045* (2013.01); *C23C 16/34* (2013.01);
(Continued)

(58) Field of Classification Search
CPC .................................................... Y10T 428/30
(Continued)

(56) References Cited

U.S. PATENT DOCUMENTS

| 4,724,169 A | 2/1988 | Keem et al. |
| 5,646,425 A | 7/1997 | Beach |

(Continued)

FOREIGN PATENT DOCUMENTS

JP    2002-306957 A    10/2002

OTHER PUBLICATIONS

Johansson, P. et al. "Atomic Layer Deposition Process for Barrier Applications of Flexible Packaging," 2010 Place Conference, Apr. 18-21, 2010, 33 pages, Albuquerque, New Mexico.

(Continued)

Primary Examiner — Daniel H Miller
(74) Attorney, Agent, or Firm — Lowenstein Sandler LLP

(57) ABSTRACT

Described herein are articles, systems and methods where a plasma resistant coating is deposited onto a surface of a porous chamber component and onto pore walls within the porous chamber component using an atomic layer deposition (ALD) process. The porous chamber component may include a porous body comprising a plurality of pores within the porous body, the plurality of pores each comprising pore walls. The porous body is permeable to a gas. The plasma resistant coating may comprise a solid solution of $Y_2O_3$—$ZrO_2$ and may have a thickness of about 5 nm to about 3 μm, and may protect the pore walls from erosion. The porous body with the plasma resistant coating remains permeable to the gas.

24 Claims, 9 Drawing Sheets

(51) Int. Cl.
  *C23C 16/40* (2006.01)
  *C23C 16/50* (2006.01)
  *C23C 16/34* (2006.01)
  *C23C 16/04* (2006.01)
  *H01J 37/32* (2006.01)

(52) U.S. Cl.
  CPC .......... *C23C 16/402* (2013.01); *C23C 16/403* (2013.01); *C23C 16/405* (2013.01); *C23C 16/45525* (2013.01); *C23C 16/45531* (2013.01); *C23C 16/50* (2013.01); *H01J 37/32477* (2013.01)

(58) Field of Classification Search
  USPC .......................................... 428/408; 423/448
  See application file for complete search history.

(56) References Cited

U.S. PATENT DOCUMENTS

| | | | |
|---|---|---|---|
| 5,805,973 | A | 9/1998 | Coffinberry et al. |
| 6,352,620 | B2 | 3/2002 | Yu et al. |
| 6,432,256 | B1 | 8/2002 | Raoux |
| 6,548,424 | B2 | 4/2003 | Putkonen |
| 6,777,353 | B2 | 8/2004 | Putkonen |
| 6,835,417 | B2 | 12/2004 | Saenger et al. |
| 6,858,546 | B2 | 2/2005 | Niinisto et al. |
| 7,351,658 | B2 | 4/2008 | Putkonen |
| 7,498,272 | B2 | 3/2009 | Niinisto et al. |
| 7,696,117 | B2 | 4/2010 | Sun et al. |
| 7,732,067 | B2 | 6/2010 | Zurbuchen |
| 7,754,621 | B2 | 7/2010 | Putkonen |
| 7,998,883 | B2 | 8/2011 | Putkonen |
| 8,129,029 | B2 | 3/2012 | Sun et al. |
| 8,252,410 | B2 | 8/2012 | Rasheed |
| 8,367,227 | B2 | 2/2013 | Sun et al. |
| 8,758,858 | B2 | 6/2014 | Sun et al. |
| 8,858,745 | B2 | 10/2014 | Sun et al. |
| 8,871,312 | B2 | 10/2014 | Sun et al. |
| 9,017,765 | B2 | 4/2015 | Sun et al. |
| 9,212,099 | B2 | 12/2015 | Sun et al. |
| 2002/0095782 | A1* | 7/2002 | Narendrnath ....... H01L 21/6831 29/832 |
| 2003/0029563 | A1 | 2/2003 | Kaushal et al. |
| 2004/0023811 | A1 | 2/2004 | Iijima |
| 2004/0099285 | A1 | 5/2004 | Wang et al. |
| 2004/0136681 | A1 | 7/2004 | Drewery et al. |
| 2004/0151841 | A1 | 8/2004 | Trickett et al. |
| 2007/0026246 | A1 | 2/2007 | Harada et al. |
| 2008/0032115 | A1 | 2/2008 | Umeki et al. |
| 2008/0048225 | A1 | 2/2008 | Ahn et al. |
| 2008/0108225 | A1 | 5/2008 | Sun et al. |
| 2008/0213496 | A1 | 9/2008 | Sun et al. |
| 2008/0264565 | A1 | 10/2008 | Sun et al. |
| 2009/0302434 | A1 | 12/2009 | Pallem et al. |
| 2010/0048028 | A1 | 2/2010 | Rasheed et al. |
| 2010/0119843 | A1 | 5/2010 | Sun et al. |
| 2013/0162142 | A1 | 6/2013 | Nishino et al. |
| 2013/0162143 | A1 | 6/2013 | Chen et al. |
| 2014/0120312 | A1 | 5/2014 | He et al. |
| 2014/0349073 | A1 | 11/2014 | Sun et al. |
| 2014/0377504 | A1 | 12/2014 | Sun et al. |
| 2015/0004411 | A1 | 1/2015 | Sun et al. |
| 2015/0021324 | A1 | 1/2015 | Sun et al. |
| 2015/0024155 | A1 | 1/2015 | Sun et al. |
| 2015/0133285 | A1 | 5/2015 | Sun et al. |
| 2015/0147562 | A1* | 5/2015 | Sambasivan .......... C04B 35/195 428/312.6 |
| 2015/0158775 | A1 | 6/2015 | Sun et al. |
| 2015/0311044 | A1 | 10/2015 | Sun et al. |
| 2015/0376780 | A1* | 12/2015 | Khaja ................. C23C 16/4405 134/1.1 |
| 2016/0254125 | A1 | 9/2016 | Huang et al. |
| 2016/0312351 | A1 | 10/2016 | Liu et al. |
| 2016/0336210 | A1 | 11/2016 | Cooke et al. |
| 2016/0358749 | A1 | 12/2016 | Sant |
| 2016/0375515 | A1* | 12/2016 | Xu ....................... B23K 1/0008 428/623 |
| 2016/0379806 | A1 | 12/2016 | Xu et al. |

OTHER PUBLICATIONS

Tamm, Aile et al. Atomic layer deposition and characterization of zirconium oxide-erbium oxide nanolaminates. Thin Solid Finis 519 (2010) 666-673.

Rönn, J., "Fabrication and characterization of atomic-layer-deposited $Er_2O_3$ for optical amplifier devices", Master Thesis for Aalto University School of Electrical Engineering, Dec. 1, 2014, 71 pages, Espoo, Finland.

* cited by examiner

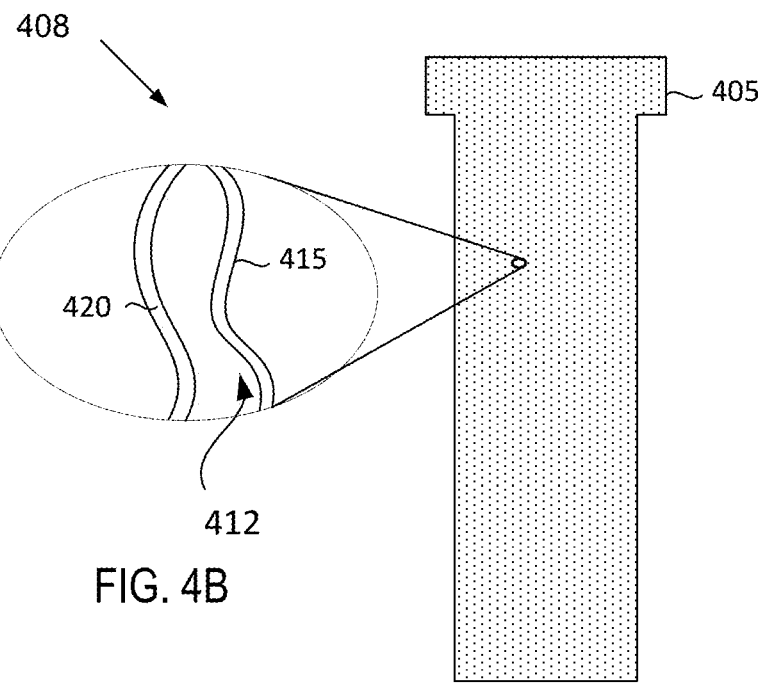
FIG. 4B
FIG. 4A
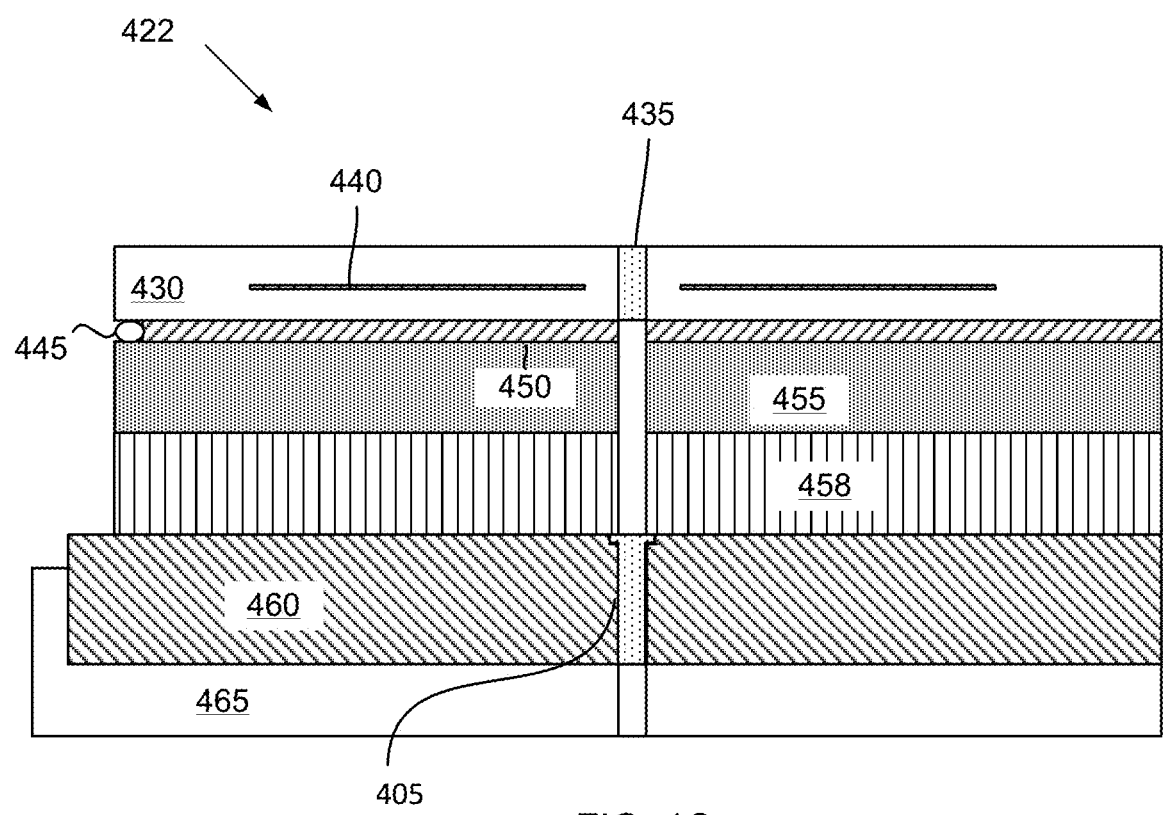
FIG. 4C

PLASMA RESISTANT COATING OF POROUS BODY BY ATOMIC LAYER DEPOSITION

RELATED APPLICATIONS

The present application is a continuation of U.S. patent application Ser. No. 15/462,718, filed Mar. 17, 2017, which is incorporated by reference herein.

TECHNICAL FIELD

Embodiments of the disclosure relate to articles, coated chamber components and methods of coating chamber components with a plasma resistant coating. The plasma resistant coating can include a high purity oxide layer that coats all surfaces of a porous component including pore walls within the component. Optionally, the plasma resistant coating can include a rare-earth metal-containing oxide layer and/or an aluminum oxide layer. The coating is formed using a non-line of sight technique such as atomic layer deposition.

BACKGROUND

Various manufacturing processes expose semiconductor process chamber components to high temperatures, high energy plasma, a mixture of corrosive gases, high stress, and combinations thereof. These extreme conditions may erode and/or corrode the chamber components, increasing the chamber components' susceptibility to defects. It is desirable to reduce these defects and improve the components' erosion and/or corrosion resistance in such extreme environments.

Protective coatings are typically deposited on chamber components by a variety of methods, such as thermal spray, sputtering, ion assisted deposition (IAD), plasma spray or evaporation techniques. These techniques generally cannot deposit coatings onto pore walls of pores within such chamber components.

SUMMARY

Some embodiments described herein involve a coated porous article (e.g., a porous plug from an electrostatic chuck). The article comprises a porous body comprising a plurality of pores within the porous body, the plurality of pores each comprising pore walls. The porous body is permeable to a gas. The article further comprises a plasma resistant coating on a surface of the porous body and on the pore walls of the plurality of pores within the porous body. The plasma resistant coating may have a thickness of about 5 nm to about 3 µm. The plasma resistant coating protects the pore walls from erosion. The porous body with the plasma resistant coating remains permeable to the gas.

In some embodiments a method includes performing atomic layer deposition to deposit a plasma resistant coating on a porous chamber component comprising a plurality of pores, the plurality of pores each comprising pore walls. The porous body is permeable to a gas. Performing the atomic layer deposition comprises depositing the plasma resistant coating onto a surface of the porous chamber component and depositing the plasma resistant coating onto the pore walls of the plurality of pores within the porous chamber component. The plasma resistant coating may have a thickness of about 5 nm to about 3 µm, wherein the plasma resistant coating protects the pore walls from erosion, and wherein the porous chamber component with the plasma resistant coating remains permeable to the gas after performing the atomic layer deposition.

In some embodiments a method includes loading a plurality of porous ceramic plugs together into a deposition chamber. A porous ceramic plug of the plurality of porous ceramic plugs is permeable to gas and comprises a plurality of pores, the plurality of pores each comprising pore walls. The method further includes performing atomic layer deposition to deposit an aluminum oxide coating on the plurality of porous ceramic plugs concurrently. Performing the atomic layer deposition for the porous ceramic plug of the plurality of porous ceramic plugs comprises depositing the aluminum oxide coating onto a surface of the porous ceramic plug and depositing the aluminum oxide coating onto the pore walls of the plurality of pores within the porous ceramic plug. The aluminum oxide coating may have a thickness of about 5 nm to about 3 µm. The aluminum oxide coating protects the pore walls from erosion, and the porous ceramic plug with the plasma resistant coating remains permeable to the gas after performing the atomic layer deposition.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 4A depicts a plug for an electrostatic chuck chamber component, in accordance with embodiments.

FIG. 4B depicts a blown up view of pores within the plug for the electrostatic chuck, wherein an interior surface of each pore is coated with a plasma resistant coating as described herein.

FIG. 4C depicts a substrate support assembly that includes multiple porous ceramic plugs that have been coated in accordance with embodiments described herein.

DETAILED DESCRIPTION

Figure 1:
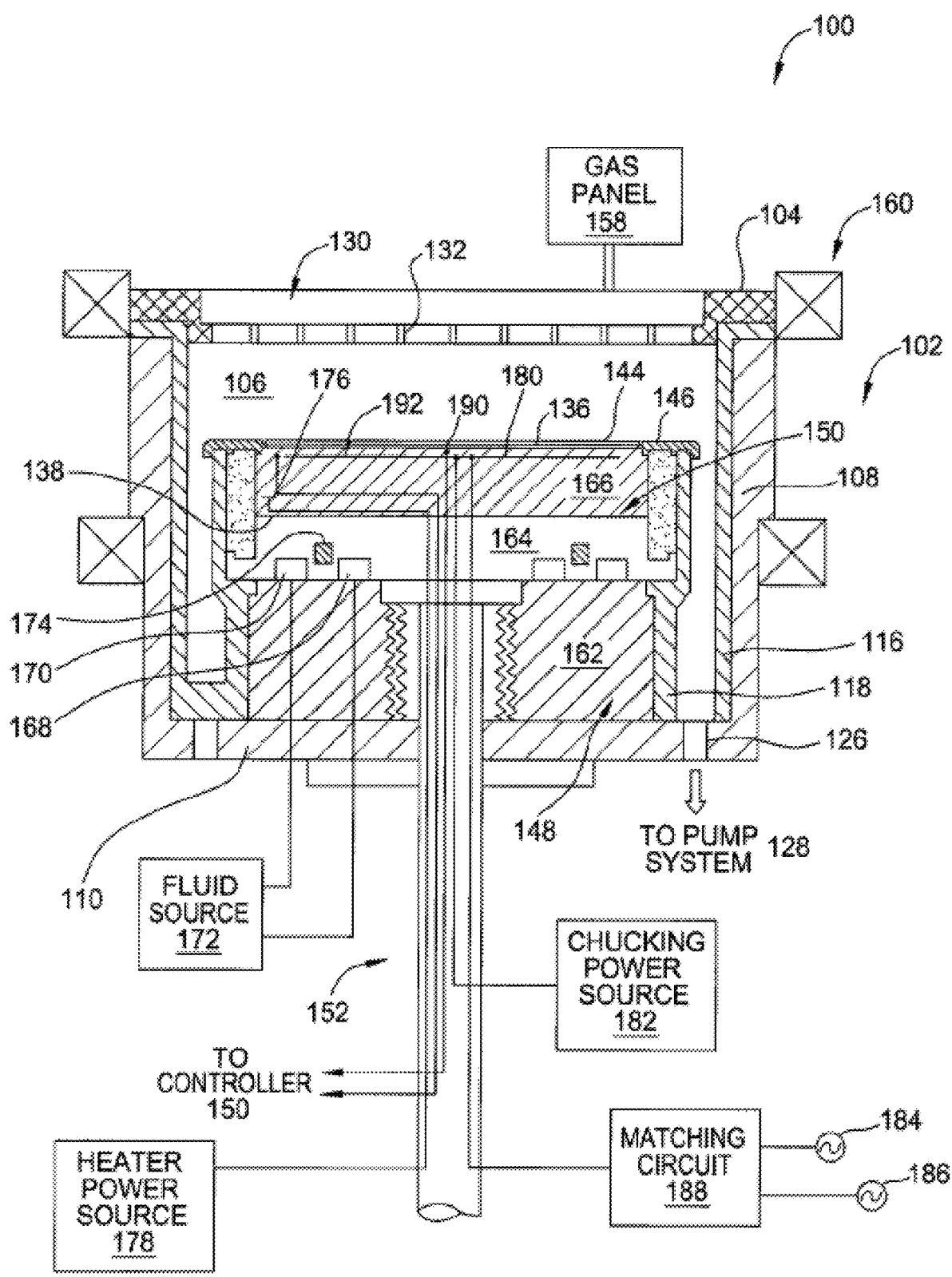
FIG. 1 depicts a sectional view of a processing chamber.

Embodiments described herein cover articles, coated chamber components and methods where a plasma resistant coating is deposited onto pore walls of pores within a porous ceramic body of the articles. The plasma resistant coating may be a high purity metal oxide layer (e.g., high purity aluminum oxide) or a rare earth metal-containing oxide layer (e.g., a yttrium-containing oxide layer). The plasma resistant coating may additionally be a multi-layer coating that includes one or more metal oxide layer as well as one or more rare earth metal-containing oxide layer. As used herein, the term plasma resistant means resistant to a plasma of at least one type of gas as well as chemistry and radicals of the at least one type of gas. The article may be a porous ceramic material. The deposition process is a non-line of sight process such as an atomic layer deposition (ALD) process.

The thickness of the plasma resistant coating may be about 5 nm to about 300 nm in some embodiments. The plasma resistant coating may conformally cover a surface of the chamber component as well as the pore walls of the pores within the chamber component with a substantially uniform thickness. In one embodiment, the plasma resistant coating has a conformal coverage of the underlying surface that is coated (including coated pore walls) with a uniform thickness having a thickness variation of less than +/−20%, or a thickness variation of less than +/−10%, or a thickness variation of less than +/−5%, or a lower thickness variation.

Embodiments described herein enable the pore walls within a porous ceramic body such as a porous ceramic plug for an electrostatic chuck to be effectively coated with plasma resistant coatings. The porous ceramic body may be permeable to one or more gases. The plasma resistant coatings on the pore walls may protect the pore walls from erosion by the one or more gases without plugging the porous ceramic body. Therefore, the porous ceramic body may remain permeable to the one or more gases after being coated by the plasma resistant coating. The plasma resistant coating is also dense with a porosity of about 0% (e.g., the plasma resistant coating may be porosity-free in embodiments). The plasma resistant coatings may be resistant to corrosion and erosion from plasma etch chemistries, such as $CCl_4/CHF_3$ plasma etch chemistries, $HCl_3Si$ etch chemistries and $NF_3$ etch chemistries.

ALD allows for a controlled self-limiting deposition of material through chemical reactions with the surface of the article. Aside from being a conformal process, ALD is also a uniform process. All exposed sides of the article, including high aspect ratio features (e.g., about 3:1 to 300:1) will have the same or approximately the same amount of material deposited. As set forth herein, the inner walls of pores within a porous ceramic body are also coated using the ALD process without plugging the porous ceramic body or reducing a permeability of the porous ceramic body. A typical reaction cycle of an ALD process starts with a precursor (i.e., a single chemical A) flooded into an ALD chamber and adsorbed onto surfaces of the article (including surfaces of pore walls within the article). The excess precursor is then flushed out of the ALD chamber before a reactant (i.e., a single chemical R) is introduced into the ALD chamber and subsequently flushed out. For ALD, the final thickness of material is dependent on the number of reaction cycles that are run, because each reaction cycle will grow a layer of a certain thickness that may be one atomic layer or a fraction of an atomic layer.

Unlike other techniques typically used to deposit coatings on porous components having high aspect ratio features (e.g., pores), such as plasma spray coating and ion assisted deposition, the ALD technique can deposit a layer of material within such features (i.e., on the pore walls of the pores within the porous components). Additionally, the ALD technique produces relatively thin (i.e., 1 μm or less) coatings that are porosity-free (i.e., pin-hole free), which may eliminate crack formation during deposition. The term "porosity-free" as used herein means absence of any pores, pin-holes, voids, or cracks along the whole depth of the coating as measured by transmission electron microscopy (TEM). The TEM may be performed using a 100 nm thick TEM lamella prepared by focused ion beam milling, with the TEM operated at 200 kV in bright-field, dark-field, or high-resolution mode. In contrast, with conventional e-beam IAD or plasma spray techniques, pore walls of pores within a porous component are not coated. Instead, the surface of the porous component is coated in a manner that covers and plugs the pores and reduces or eliminates the permeability of the porous component.

Porous process chamber components, such as plugs for electrostatic chucks (ESCs), would benefit from having these plasma resistant coatings to protect the components in harsh etch environments while not impacting their performance. Conventional deposition methods also can result in coatings that reduce the porosity of the plugs and therefore impact their performance. The plugs are permeable to at least some gases and are designed to filter gas particles or block radical penetration into the cavity of the ESC and to prevent secondary plasma light up in the ESC. Thus, a goal of some embodiments is to maintain the porosity and/or permeability of the plugs. Embodiments described herein enable the inner pore walls of porous ceramic articles such as the aforementioned porous chamber components to be coated with plasma resistant coatings that protect the articles without affecting their porosity or permeability.

FIG. 1 is a sectional view of a semiconductor processing chamber 100 having one or more chamber components that are coated with a plasma resistant coating in accordance with embodiments. The processing chamber 100 may be used for processes in which a corrosive plasma environment having plasma processing conditions is provided. For example, the processing chamber 100 may be a chamber for a plasma etcher or plasma etch reactor, a plasma cleaner, plasma enhanced CVD or ALD reactors and so forth. An example of chamber a component that may include the plasma resistant coating includes a porous ceramic plug of an electrostatic chuck (ESC) 150. The plasma resistant coating, which is described in greater detail below, is applied by ALD. ALD allows for the application of a conformal coating of a substantially uniform thickness that is porosity-free on all types of components including porous components with complex shapes and features having high aspect ratios.

The plasma resistant coating may be grown or deposited using ALD with a precursor for a metal oxide layer such as an aluminum-containing precursor. The plasma resistant coating may additionally or alternatively be grown or deposited using ALD with one or more precursors for deposition of a rare earth metal-containing oxide or co-deposition of a rare earth metal-containing oxide in combination with one or more additional oxides to form a rare earth metal-containing oxide layer. In one embodiment, the rare earth metal-containing oxide layer has a polycrystalline structure. Alternatively, the rare earth metal-containing oxide layer may have an amorphous structure. The rare earth metal-containing oxide may include yttrium, tantalum, zirconium and/or erbium. For example, the rare earth metal-containing oxide may be yttria ($Y_2O_3$), erbium oxide ($Er_2O_3$), zirconium oxide ($ZrO_2$), tantalum oxide ($Ta_2O_5$), and so on. In embodiments, the rare-earth metal-containing oxide is polycrystalline yttria. In other embodiments, the rare-earth metal-containing oxide is amorphous yttria. The rare earth metal-containing oxide may also include aluminum mixed with one or more rare earth elements such as yttrium, zirconium and/or erbium. The additional oxide (or oxides) that may be co-deposited with the rare earth metal-containing oxide to form the rare earth metal-containing oxide layer may include zirconium oxide ($ZrO_2$), aluminum oxide ($Al_2O_3$), erbium oxide ($Er_2O_3$), or a combination thereof. A yttrium-containing oxide layer for the multi-layer plasma resistant coating may be, for example, $Y_xZr_yO_z$, $Y_aZr_xAl_yO_z$, $Y_xAl_yO_z$, or $Y_xEr_yO_z$. The yttrium-containing oxide may be yttria ($Y_2O_3$) with yttriaite having a cubic structure with space group Ia-3 (206).

In one embodiment, the rare-earth metal-containing oxide layer is one of $Y_2O_3$, $Er_2O_3$, $Y_3Al_5O_{12}$ (YAG), $Er_3Al_5O_{12}$ (EAG), or $Y_4Al_2O_9$ (YAM). The rare-earth metal-containing oxide layer may also be $YAlO_3$ (YAP), $Er_4Al_2O_9$ (EAM), $ErAlO_3$ (EAP), a solid-solution of $Y_2O_3$—$ZrO_2$ and/or a ceramic compound comprising $Y_4Al_2O_9$ and a solid-solution of $Y_2O_3$—$ZrO_2$.

With reference to the solid-solution of $Y_2O_3$—$ZrO_2$, the rare-earth metal-containing oxide layer may include $Y_2O_3$ at a concentration of 10-90 molar ratio (mol %) and $ZrO_2$ at a concentration of 10-90 mol %. In some examples, the solid-solution of $Y_2O_3$—$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol % $ZrO_2$, may include 60-70 mol % $Y_2O_3$ and 30-40 mol % $ZrO_2$, may include 70-80 mol % $Y_2O_3$ and 20-30 mol % $ZrO_2$, may include 80-90 mol % $Y_2O_3$ and 10-20 mol % $ZrO_2$, and so on.

With reference to the ceramic compound comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0.1-60 mol % and $Al_2O_3$ in a range of 0.1-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0.1-20 mol % and $Al_2O_3$ in a range of 10-20 mol %. In another embodiment, the ceramic compound can include $Y_2O_3$ in a range of 60-80 mol %, $ZrO_2$ in a range of 0.1-10 mol % and $Al_2O_3$ in a range of 20-40 mol %. In another embodiment, the ceramic compound can include $Y_2O_3$ in a range of 40-60 mol %, $ZrO_2$ in a range of 0.1-20 mol % and $Al_2O_3$ in a range of 30-40 mol %. In other embodiments, other distributions may also be used for the ceramic compound.

In one embodiment, an alternative ceramic compound that includes a combination of $Y_2O_3$, $ZrO_2$, $Er_2O_3$, $Gd_2O_3$ and $SiO_2$ is used for the rare-earth metal-containing oxide layer. In one embodiment, the alternative ceramic compound can include $Y_2O_3$ in a range of 40-45 mol %, $ZrO_2$ in a range of 0-10 mol %, $Er_2O_3$ in a range of 35-40 mol %, $Gd_2O_3$ in a range of 5-10 mol % and SiO2 in a range of 5-15 mol %. In a first example, the alternative ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the alternative ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the alternative ceramic compound includes 40 mol % $Y_2O_3$, 5 mol % $ZrO_2$, 40 mol % $Er_2O_3$, 7 mol % $Gd_2O_3$ and 8 mol % $SiO_2$.

Any of the aforementioned rare-earth metal-containing oxide layers may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

The metal oxide layer may include high purity aluminum oxide or similar material that when used alone protects the component from plasma corrosion to at least some plasmas. It also improves adhesion of a rare-earth metal-containing oxide layer (when used) to the chamber component and provides thermal resistance to cracking and delamination of the plasma resistant coating at temperatures up to about 350° C. in embodiments or at about 200° C. or from about 200° C. to about 350° C.

In one embodiment, the processing chamber 100 includes a chamber body 102 and a showerhead 130 that enclose an interior volume 106. The showerhead 130 may include a showerhead base and a showerhead gas distribution plate. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material. The chamber body 102 generally includes sidewalls 108 and a bottom 110.

An outer liner 116 may be disposed adjacent the sidewalls 108 to protect the chamber body 102. The outer liner 116 may be fabricated and/or coated with a bi-layer coating. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 includes a gas distribution plate (GDP) 133 having multiple gas delivery holes 132 throughout the GDP 133. The showerhead 130 may include the GDP 133 bonded to an aluminum base or an anodized aluminum base. The GDP 133 may be made from Si or SiC, or may be a ceramic such as $Y_2O_3$, $Al_2O_3$, $Y_3Al_5O_{12}$ (YAG), and so forth.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). The substrate support assembly 148 is disposed in the interior volume 106 of the processing chamber 100 below the showerhead 130 or lid. The substrate support assembly 148 holds the substrate 144 during processing. A ring 146 (e.g., a single ring) may cover a portion of the electrostatic chuck 150, and may protect the covered portion from exposure to plasma during processing. The ring 146 may be silicon or quartz in one embodiment.

An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166 bonded to the thermally conductive base by a bond 138, which may be a silicone bond in one embodiment. An upper surface of the electrostatic puck 166 may be covered by the plasma resistant coating 136 in the illustrated embodiment. The plasma resistant coating 136 may be disposed on the entire exposed surface of the electrostatic chuck 150 including the outer and side periphery of the thermally conductive base 164 and the electrostatic puck 166 as well as any other geometrically complex parts or holes having large aspect ratios in the electrostatic chuck. In one embodiment, a plasma resistant coating coats pore walls of pores within ceramic plugs (not shown) that are inserted into one or more holes in the electrostatic puck 166. Ceramic plugs are described in more detail below with respect to FIGS. 4A-4C. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the substrate support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164. The conduits and heater heat and/or cool the electrostatic puck 166 and a substrate (e.g., a wafer) 144 being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features that may be formed in an upper surface of the puck 166. The gas passages may be fluidly coupled to a source of a heat transfer (or backside) gas such as He via holes drilled in the electrostatic puck 166. In operation, the backside gas may be provided at controlled pressure into the gas passages to enhance the heat transfer between the electrostatic puck 166 and the substrate 144. The He via holes may be plugged by porous ceramic plugs that are permeable to the He. The porous ceramic plugs may also be at least partially permeable to corrosive gases and plasmas that are used to clean the semiconductor processing chamber 100. The porous ceramic plugs may filter gas particles of the corrosive gases and prevent such corrosive gases from penetrating into the substrate support assembly. The porous ceramic plugs may additionally prevent a secondary plasma from forming within the He vias in the electrostatic puck 166. However, the porous ceramic plugs may erode after repeated cleaning cycles. Additionally, a chemistry of the porous ceramic plugs may change as the porous ceramic plug is exposed to fluorine (e.g., the porous ceramic plug may lose Si and gain fluorine). Accordingly, the porous ceramic plugs may be coated in accordance with embodiments herein to extend the life of the porous ceramic plugs.

The electrostatic puck 166 includes at least one clamping electrode 180 controlled by a chucking power source 182. The clamping electrode 180 (or other electrode disposed in the electrostatic puck 166 or base 164) may further be coupled to one or more RF power sources 184, 186 through a matching circuit 188 for maintaining a plasma formed from process and/or other gases within the processing chamber 100. The RF power sources 184, 186 are generally capable of producing RF signal having a frequency from about 50 kHz to about 3 GHz and a power of up to about 10,000 Watts.

Figure 2A:
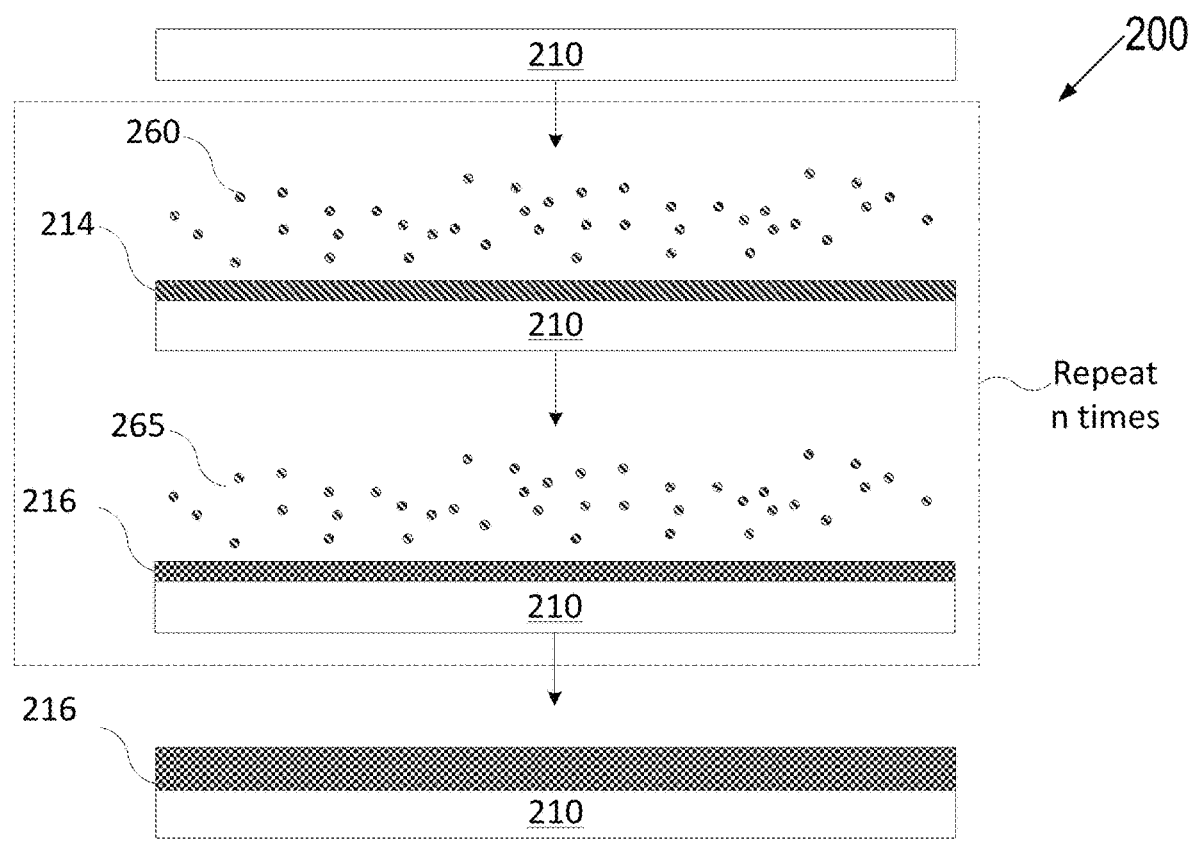
FIG. 2A depicts one embodiment of a deposition process in accordance with an atomic layer deposition technique as described herein.
Figure 2B:
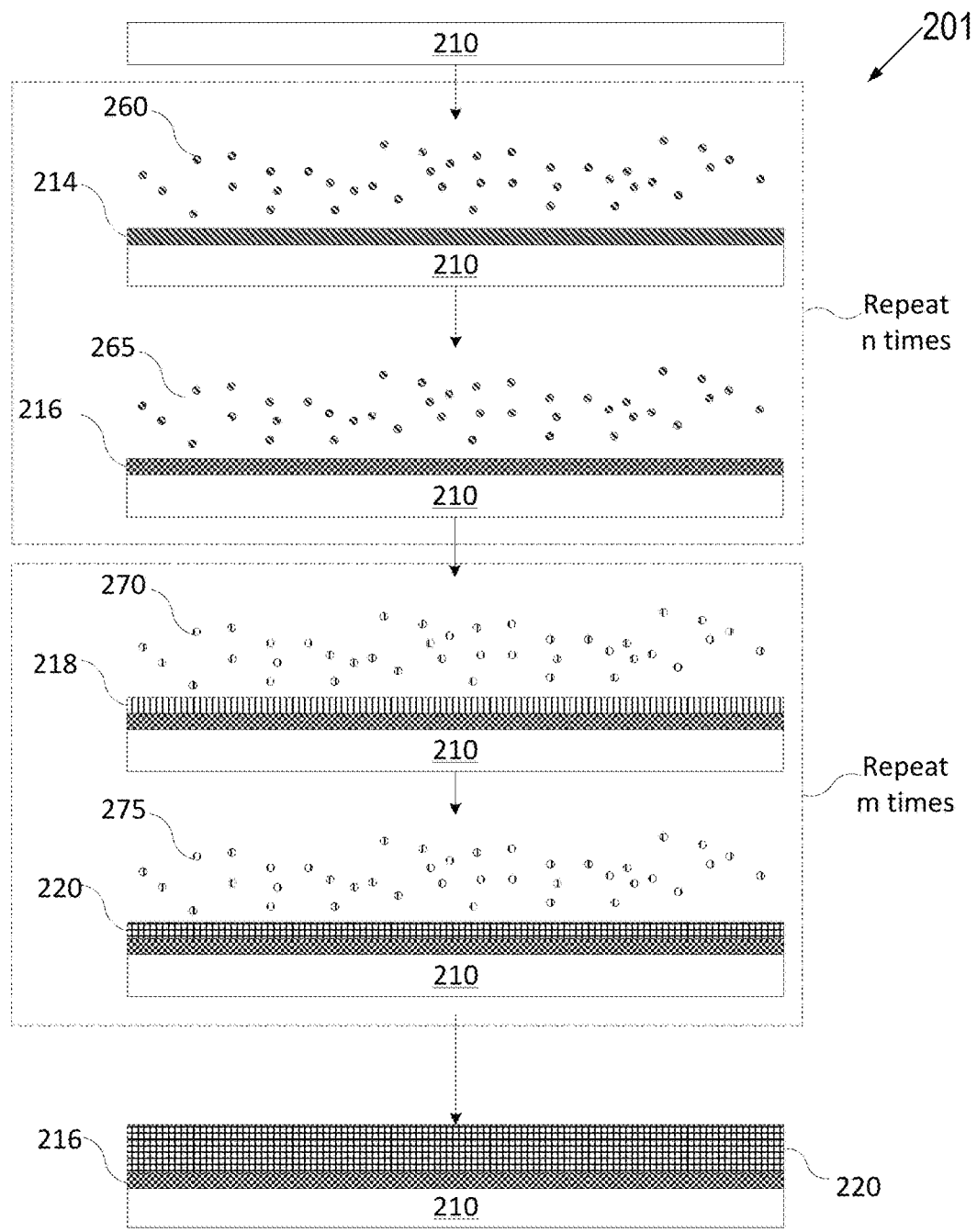
FIG. 2B depicts another embodiment of a deposition process in accordance with an atomic layer deposition technique as described herein.
Figure 2C:
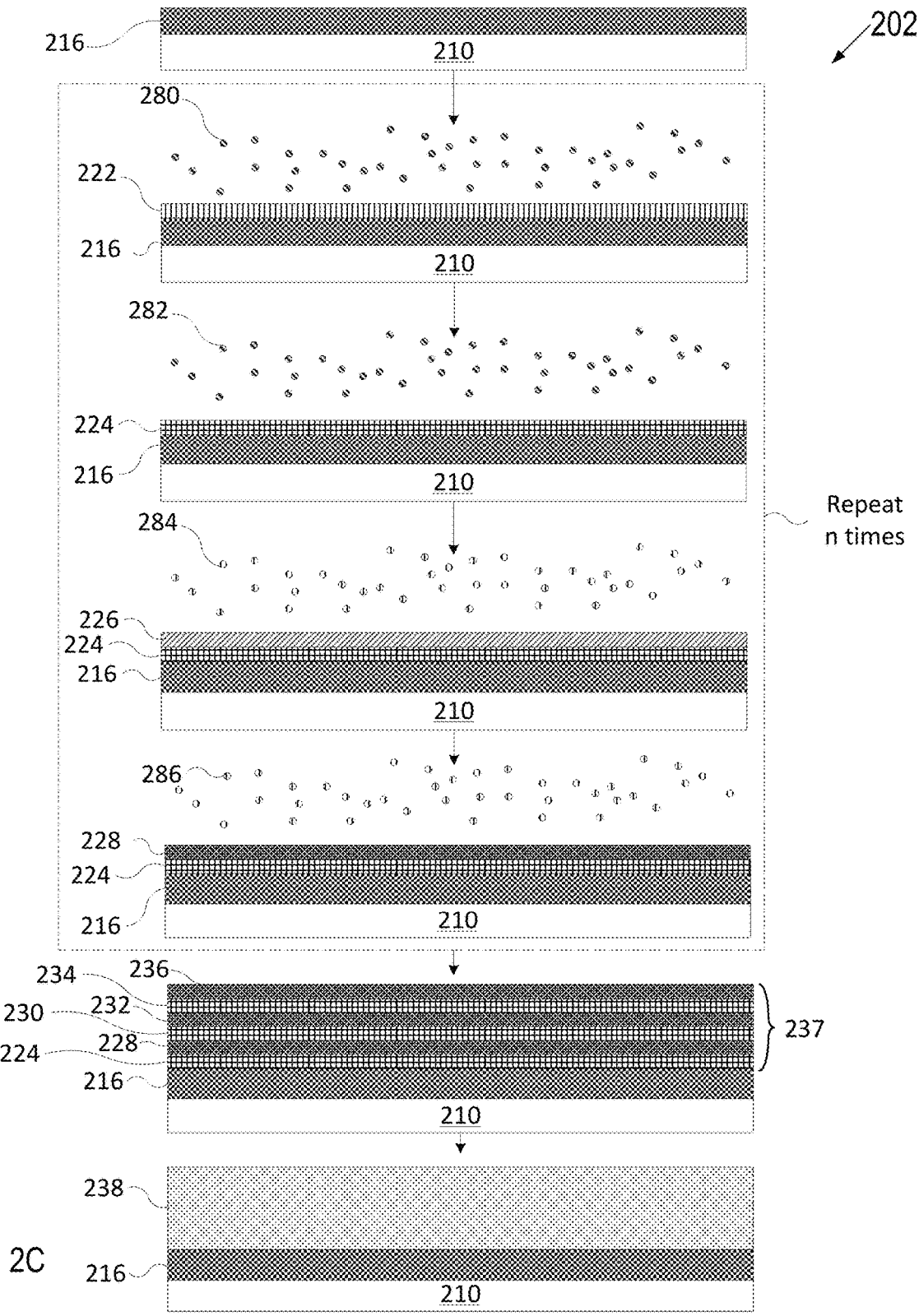
FIG. 2C depicts another embodiment of a deposition process in accordance with an atomic layer deposition technique as described herein.
Figure 2D:
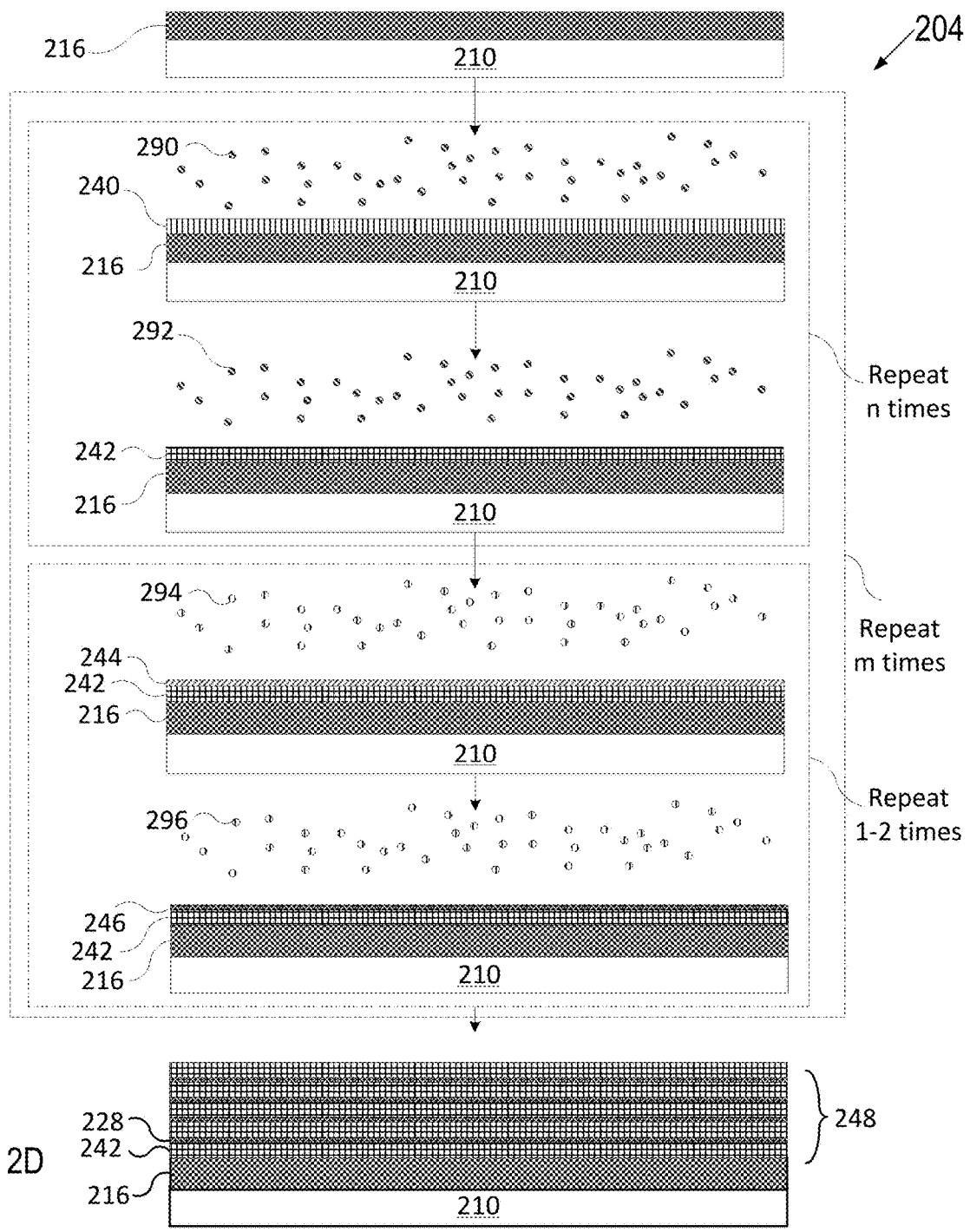
FIG. 2D depicts another embodiment of a deposition process in accordance with an atomic layer deposition technique as described herein.

FIG. 2A depicts one embodiment of a deposition process in accordance with an ALD technique to grow or deposit a plasma resistant coating on an article (including on pore walls within an article). FIG. 2B depicts one embodiment of a deposition process in accordance with an ALD technique to grow or deposit a multi-layer plasma resistant coating on an article (including on pore walls within an article). FIG. 2C depicts another embodiment of a deposition process in accordance with an atomic layer deposition technique as described herein. FIG. 2D depicts another embodiment of a deposition process in accordance with an atomic layer deposition technique as described herein.

Various types of ALD processes exist and the specific type may be selected based on several factors such as the surface to be coated, the coating material, chemical interaction between the surface and the coating material, etc. The general principle for the various ALD processes comprises growing a thin film layer by repeatedly exposing the surface to be coated to pulses of gaseous chemical precursors that chemically react with the surface one at a time in a self-limiting manner.

FIGS. 2A-2D illustrate an article 210 having a surface. Article 210 may represent various porous process chamber components (e.g., semiconductor process chamber components) including but not limited to a porous ceramic plug for an electrostatic chuck or substrate support assembly. The article 210 may be made from a ceramic, a metal-ceramic composite (such as AlO/SiO, AlO/MgO/SiO, SiC, SiN, AlN/SiO and the like), a metal (such as aluminum, stainless steel), a polymer, a polymer ceramic composite, mylar, polyester, or other suitable materials, and may further comprise materials such as AN, Si, SiC, $Al_2O_3$, $SiO_2$, and so on. In one embodiment, the article 210 is a ceramic porous plug that is composed of a two phase material comprising sintered particles of a first oxide and a second oxide that acts as a binder for the sintered particles of the first oxide. The two phase material may be arranged in a porous matrix. The first oxide may be $Al_2O_3$ or AN, and the second oxide may be $SiO_2$, for example. A challenge for these materials is that the $SiO_2$ containing phase has little resistance to a fluorinating chemistry and gets etched away very fast resulting in breaking the porous matrix and generation of particulates.

For ALD, either adsorption of a precursor onto a surface or a reaction of a reactant with the adsorbed precursor may be referred to as a "half-reaction." During a first half reaction, a precursor is pulsed onto the surface of the article 210 (including onto a surface of pore walls within the article 210) for a period of time sufficient to allow the precursor to fully adsorb onto the surface. The adsorption is self-limiting as the precursor will adsorb onto a finite number of available sites on the surface, forming a uniform continuous adsorption layer on the surface. Any sites that have already adsorbed with a precursor will become unavailable for further adsorption with the same precursor unless and/or until the adsorbed sites are subjected to a treatment that will form new available sites on the uniform continuous coating. Exemplary treatments may be plasma treatment, treatment by exposing the uniform continuous adsorption layer to radicals, or introduction of a different precursor able to react with the most recent uniform continuous layer adsorbed to the surface.

In some implementations, two or more precursors are injected together and adsorbed onto the surface of an article. The excess precursors are pumped out until an oxygen-containing reactant is injected to react with the adsorbates to form a solid single phase or multi-phase layer (e.g., of YAG, a phase of $Y_2O_3$—$ZrO_2$, and so on). This fresh layer is ready to adsorb the precursors in the next cycle.

In FIG. 2A, article 210 may be introduced to a first precursor 260 for a first duration until a surface of article 210 is fully adsorbed with the first precursor 260 to form an adsorption layer 214. Subsequently, article 210 may be introduced to a first reactant 265 to react with the adsorption layer 214 to grow a solid layer 216 (e.g., so that the layer 216 is fully grown or deposited, where the terms grown and deposited may be used interchangeably herein). The first precursor 260 may be a precursor for a high purity metal oxide, for example, high purity aluminum oxide. The first reactant 265 may be oxygen, water vapor, ozone, pure oxygen, oxygen radicals, or another oxygen source if the layer 216 is an oxide. Accordingly, ALD may be used to form the layer 216. The layer 216 may be a plasma resistant coating, or may be one layer of a multi-layer plasma resistant coating.

In an example where the layer 216 is a high purity alumina (HP—$Al_2O_3$) layer, article 210 (e.g., a porous ceramic plug for an ESC) may be introduced to a first precursor 260 (e.g., trimethyl aluminum (TMA)) for a first duration until all the reactive sites on the article's surfaces (including inside the pores) are consumed. The remaining first precursor 260 is flushed away and then a first reactant 265 of $H_2O$ is injected into the reactor to start the second half cycle. A layer 216 of HP—$Al_2O_3$ is formed after $H_2O$ molecules react with the Al containing adsorption layer created by the first half reaction.

Layer 216 may be uniform, continuous and conformal. Layer 216 may be porosity free (e.g., have a porosity of zero) or have an approximately zero porosity in embodiments (e.g., a porosity of 0% to 0.01%). Layer 216 may have a thickness of less than one atomic layer to a few atoms in some embodiments after a single ALD deposition cycle. Some metalorganic precursor molecules are large. After reacting with the reactant 265, large organic ligands may be gone, leaving much smaller metal atoms. One full ALD cycle (e.g., that includes introduction of precursors 260 followed by introduction of reactants 265) may result in less than a single atomic layer. For example, an $Al_2O_3$ monolayer grown by TMA and $H_2O$ typically has a growth rate of about 0.9 A/cycle to about 1.3 A/cycle while the $Al_2O_3$ lattice constant is a −4.7 A and c=13 A (for a trigonal structure).

Multiple full ALD deposition cycles may be implemented to deposit a thicker layer 216, with each full cycle (e.g., including introducing precursor 260, flushing, introducing reactant 265, and again flushing) adding to the thickness by an additional fraction of an atom to a few atoms. As shown, up to n full cycles may be performed to grow the layer 216, where n is an integer value greater than 1. In embodiments, layer 216 may have a thickness of about 5 nm to about 3 μm. In a further embodiment, layer 216 has a thickness of about 5 nm to about 300 nm. Layer 216 may have a thickness of about 10 nm to about 150 nm in embodiments or about 50 nm to about 100 nm in other embodiments.

The layer 216 provides robust plasma resistance and mechanical properties. Layer 216 may protect the component from corrosion, enhance dielectric strength, provide better adhesion of a rare-earth metal-containing oxide layer to the component (e.g., formed of porous ceramic or Al6061, Al6063), and may prevent cracking of the plasma resistant coating at temperatures up to about 200° C., or up to about 250° C., or from about 200° C. to about 250° C. In further embodiments, the layer 216 may prevent cracking of the plasma resistant coating at temperatures of up to about 350° C. Since ALD is used for the deposition, the internal surfaces of high aspect ratio features such as gas delivery holes in a showerhead or pores in a porous material may be coated, and thus an entirety of a component may be protected from exposure to a corrosive environment.

Layer 216 may be HP—$Al_2O_3$, having a purity of about 89.99% to about 99.99%, in embodiments. High purity $Al_2O_3$ is significantly more resistant to plasma corrosion than typical ceramic materials used for ESC plugs. Moreover, HP—$Al_2O_3$ has good adhesion to ceramic and aluminum based components because of common elements (e.g., aluminum and oxygen). Similarly, HP—$Al_2O_3$ has good adhesion to rare earth metal-containing oxides also because of common elements (i.e., the oxides). These improved interfaces reduce interfacial defects which are prone to initiate cracks.

FIG. 2B describes a deposition process 201 that includes the deposition of layer 216 as described with reference to FIG. 2A. However, the deposition process 201 of FIG. 2B further includes deposition of an additional layer 220 to form a multi-layer plasma resistant coating. Accordingly, after layer 216 is complete, article 210 having layer 216 optionally, may be introduced to an additional one or more precursors 270 for a second duration until layer 216 is fully adsorbed with the one or more additional precursors 270 to form an adsorption layer 218. Subsequently, article 210 may be introduced to a reactant 275 to react with adsorption layer 218 to grow a solid rare-earth metal-containing oxide layer 220, also referred to as the second layer 220 for simplicity (e.g., so that the second layer 220 is fully grown or deposited). In this embodiment, layer 216 may be an amorphous metal oxide (e.g., amorphous HP—$Al_2O_3$). Accordingly, the second layer 220 is fully grown or deposited over layer 216 using ALD. In an example, precursor 270 may be a yttrium containing precursor used in the first half cycle, and reactant 275 may be $H_2O$ used in the second half cycle.

The second layer 220 may form an optional yttrium-containing oxide layer or other rare-earth metal-containing oxide layer, which may be uniform, continuous and conformal. The second layer 220 may have a very low porosity of less than 1% in embodiments, and less than 0.1% in further embodiments, and about 0% in embodiments or porosity-free in still further embodiments. Second layer 220 may have a thickness of less than an atom to a few atoms (e.g., 2-3 atoms) after a single full ALD deposition cycle. Multiple ALD deposition stages may be implemented to deposit a thicker second layer 220, with each stage adding to the thickness by an additional fraction of an atom to a few atoms. As shown, the full deposition cycle may be repeated m times to cause the second layer 220 to have a target thickness, where m is an integer value greater than 1. In embodiments, second layer 220 may have a thickness of about 5 nm to about 3 µm. In other embodiments, second layer 220 may have a thickness of about 5 nm to about 300 nm. Second layer 220 may have a thickness of about 10 nm to about 20 nm in embodiments or about 50 nm to about 60 nm in some embodiments. In other embodiments, second layer 220 may have a thickness of about 90 nm to about 110 nm.

A ratio of the second layer 220 thickness to the layer 216 thickness may be 200:1 to 1:200. A higher ratio of the second layer 220 thickness to the layer 216 thickness (e.g., 200:1, 100:1, 50:1, 20:1, 10:1, 5:1, 2:1 etc.) provides better corrosion and erosion resistance, while a lower ratio of the second layer 220 thickness to the layer 216 thickness (e.g., 1:2, 1:5, 1:10, 1:20, 1:50, 1:100, 1:200) provides better heat resistance (e.g., improved resistance to cracking and/or delamination caused by thermal cycling).

Second layer 220 may be any of the aforementioned rare-earth metal-containing oxide layers. For example, second layer 220 may be $Y_2O_3$, alone or in combination with one or more other rare earth metal oxides. In some embodiments, second layer 220 is a single phase material formed from a mixture of at least two rare earth metal-containing oxide precursors that have been co-deposited by ALD (e.g., combinations of one or more of $Y_2O_3$, $Er_2O_3$, $Al_2O_3$ and $ZrO_2$). For example, second layer 220 may be one of $Y_xZr_yO_z$, $Y_xEr_yO_z$, $Y_3Al_5O_{12}$ (YAG), $Y_4Al_2O_9$ (YAM), $Y_2O_3$ stabilized $ZrO_2$ (YSZ), or a ceramic compound comprising $Y_4Al_2O_9$ and a solid-solution of $Y_2O_3$—$ZrO_2$. In one embodiment, the layer 216 is amorphous HP—$Al_2O_3$ and the second layer 220 is a polycrystalline or amorphous yttrium-containing oxide compound (e.g., $Y_2O_3$, $Y_xAl_yO_z$, $Y_xZr_yO_z$, $Y_xEr_yO_z$) alone or in a single phase with one or more other rare earth metal-containing oxide material. Accordingly, layer 216 may be a stress relief layer that is deposited prior to deposition of the yttrium-containing oxide layer.

In some embodiments, second layer 220 may include $Er_2O_3$, $Y_2O_3$, $Al_2O_3$, or $ZrO_2$. In some embodiments, second layer 220 is a multi-component material of at least one of $Er_xAl_yO_z$ (e.g., $Er_3Al_5O_{12}$), $Er_xZr_yO_z$, $Er_aZr_xAl_yO_z$, $Y_xEr_yO_z$, or $Er_aY_xZr_yO_z$ (e.g., a single phase solid solution of $Y_2O_3$, $ZrO_2$ and $Er_2O_3$). Second layer 220 may also be one of $Y_3Al_5O_{12}$ (YAG), $Y_4Al_2O_9$ (YAM), $Y_2O_3$ stabilized $ZrO_2$ (YSZ), or a ceramic compound comprising $Y_4Al_2O_9$ and a solid-solution of $Y_2O_3$—$ZrO_2$. In one embodiment, the second layer 220 is an erbium containing compound (e.g., $Er_2O_3$, $Er_xAl_yO_z$, $Er_xZr_yO_z$, $Er_aZr_xAl_yO_z$, $Y_xEr_yO_z$, or $Er_aY_xZr_yO_z$).

With reference to FIGS. 2C-2D, in some embodiments, the plasma resistant coating contains more than two layers. Specifically, the plasma resistant coating may include a sequence of alternating layers of an oxide layer and the rare-earth metal-containing oxide layer, or may include the layer 216 and a sequence of alternating layers for the rare-earth metal-containing oxide layer. In some embodiments, a rare-earth metal-containing oxide layer is a layer of alternating sub-layers. For example, a rare-earth metal-containing oxide layer may be a series of alternating sub-layers of $Y_2O_3$ and $Al_2O_3$, a series of alternating sublayers of $Y_2O_3$ and $ZrO_2$, a series of alternating sublayers of $Y_2O_3$, $Al_2O_3$ and $ZrO_2$, and so on.

Referring to FIG. 2C, an article 210 having a layer 216 may be inserted into a deposition chamber. The layer 216 may have been formed as set forth with reference to FIG. 2A or FIG. 2B. Alternatively, an article 210 without a layer formed thereon may be provided. Article 210 may be introduced to one or more precursors 280 for a duration until the layer 216 or article 210 is fully adsorbed with the one or more additional precursors 280 to form an adsorption layer 222. Subsequently, article 210 may be introduced to a reactant 282 to react with adsorption layer 222 to grow a solid metal oxide layer 224. Accordingly, the metal oxide layer 224 is fully grown or deposited over layer 216 using ALD. In an example, precursor 280 may be a yttrium containing precursor used in the first half cycle, and reactant 282 may be $H_2O$ used in the second half cycle. The metal oxide layer 224 may be a first one of $Y_2O_3$, $ZrO_2$, $Al_2O_3$, $Er_2O_3$, $Ta_2O_5$, or another oxide.

Article 210 having layer 216 and/or metal oxide layer 224 may be introduced to one or more precursors 284 for a duration until a surface of metal oxide layer 224 is fully adsorbed with the one or more precursors 284 to form an adsorption layer 226. Subsequently, article 210 may be introduced to a reactant 286 to react with adsorption layer 226 to grow an additional solid metal oxide layer 228. Accordingly, the additional metal oxide layer 228 is fully grown or deposited over the metal oxide layer 224 using ALD. In an example, precursor 284 may be a zirconium containing precursor used in the first half cycle, and reactant 286 may be $H_2O$ used in the second half cycle. The metal oxide layer 224 may be a second one of $Y_2O_3$, $ZrO_2$, $Al_2O_3$, $Er_2O_3$, $Ta_2O_5$, or another oxide.

As shown, the deposition of the metal oxide 224 and the second metal oxide 228 may be repeated n times to form a stack 237 of alternating layers, where n is an integer value greater than 2. N may represent a finite number of layers selected based on the targeted thickness and properties. The stack 237 of alternating layers may be considered as a rare-earth metal-containing oxide layer containing multiple alternating sub-layers. Accordingly, precursors 280, reactants 284, precursors 284 and reactants 286 may be repeatedly introduced sequentially to grow or deposit additional alternating layers 230, 232, 234, 236, and so on. Each of the layers 224, 224, 230, 232, 234, 236, and so on may be very thin layers having a thickness of less than a single atomic layer to a few atomic layers. For example, an $Al_2O_3$ monolayer grown by TMA and $H_2O$ typically has a growth rate of about 0.9 to about 0.3 A/cycle while the $Al_2O_3$ lattice constant is a −4.7 A and c=13 A (for a trigonal structure).

The alternating layers 224-236 described above have a 1:1 ratio, where there is a single layer of a first metal oxide for each single layer of a second metal oxide. However, in other embodiments there may be other ratios such as 2:1, 3:1, 4:1, and so on between the different types of metal oxide layers. For example, two $Y_2O_3$ layers may be deposited for every $ZrO_2$ layer in an embodiment. Additionally, the stack 237 of alternating layers 224-236 have been described as an alternating series of two types of metal oxide layers. However, in other embodiments more than two types of metal oxide layers may be deposited in an alternating stack 237. For example, the stack 237 may include three different alternating layers (e.g., a first layer of $Y_2O_3$, a first layer of $Al_2O_3$, a first layer of $ZrO_2$, a second layer of $Y_2O_3$, a second layer of $Al_2O_3$, a second layer of $ZrO_2$, and so on).

After the stack 237 of alternating layers has been formed, an anneal process may be performed to cause the alternating layers of different materials to diffuse into one another and form a complex oxide having a single phase or multiple phases. After the annealing process, the stack of alternating layers 237 may therefore become a single rare-earth metal-containing oxide layer 238. For example, if the layers in the stack are $Y_2O_3$, $Al_2O_3$, and $ZrO_2$, then the resulting rare-earth metal-containing oxide layer 238 may a ceramic compound comprising $Y_4Al_2O_9$ and a solid-solution of $Y_2O_3$—$ZrO_2$. If the layers in the stack are $Y_2O_3$ and $ZrO_2$, then be a solid-solution of $Y_2O_3$—$ZrO_2$ may be formed.

Referring to FIG. 2D, an article 210 having a layer 216 may be inserted into a deposition chamber. Alternatively, an article 210 without such a layer 216 may be inserted into the deposition chamber. The layer 216 may have been formed as set forth with reference to FIG. 2A or FIG. 2B. Article 210 may be introduced to one or more precursors 290 for a duration until layer 216 or article 210 is fully adsorbed with the one or more precursors 290 to form an adsorption layer 240. Subsequently, article 210 may be introduced to a reactant 292 to react with adsorption layer 240 to grow a solid rare earth oxide layer 242. The precursors 290 and reactant 292 may correspond to precursors 270 and reactant 275 in embodiments. Accordingly, the rare earth oxide layer 242 is fully grown or deposited over layer 216 using ALD. The process of introducing the precursors 290 and then the reactant 292 may be repeated n times to cause the rare earth oxide layer 242 to have a target thickness, where n is an integer greater than 1.

Article 210 having layer 216 and/or rare earth oxide layer 242 may be introduced to one or more precursors 294 for a duration until a surface of rare earth oxide layer 242 is fully adsorbed with the one or more precursors 294 to form an adsorption layer 244. Subsequently, article 210 may be introduced to a reactant 296 to react with adsorption layer 244 to grow a barrier layer 246. The precursors 294 and reactants 296 may correspond to precursors 260 and reactants 265 in embodiments. Accordingly, the barrier layer 244 may have a same material composition as the surface layer 216. The barrier layer 246 is fully grown or deposited over the rare earth oxide layer 242 using ALD. The process of introducing the precursors 294 and then the reactant 296 may be performed one or two times to form a thin barrier layer 246 that may prevent crystal growth in the rare earth oxide layers.

As shown, the deposition of the rare earth oxide 242 and the barrier layer 228 may be repeated m times to form a stack 248 of alternating layers, where m is an integer value greater than 1. N may represent a finite number of layers selected based on the targeted thickness and properties. The stack 248 of alternating layers may be considered as a rare-earth metal-containing oxide layer containing multiple alternating sub-layers.

The final structure shown in FIG. 2D is a cross sectional side view of an article 210 coated with a plasma resistant coating that comprises a surface high purity metal oxide layer 216 (e.g., an amorphous metal oxide) and a stack 248 of alternating layers of a rare earth metal-containing oxide 242 and a second oxide or other ceramic 228.

The second oxide or other ceramic may be a same oxide as an oxide used to form the surface layer (e.g., $Al_2O_3$) in some embodiments. Alternatively, the second oxide or ceramic may be a different oxide than the oxide used to form the surface layer.

Each layer of the rare earth metal-containing oxide may have a thickness of about 5-10 angstroms and may be formed by performing about 5 to about 10 cycles of an ALD process, where each cycle forms a nanolayer (or slightly less or more than a nanolayer) of the rare earth metal-containing oxide. In one embodiment, each layer of the rare-earth metal-containing oxide is formed using about 6 to about 8 ALD cycles. Each layer of the second oxide or other ceramic may be formed from a single ALD cycle (or a few ALD cycles) and may have a thickness of less than an atom to a few atoms. Layers of the rare earth metal-containing oxide may each have a thickness of about 5-100 angstroms, and layers of the second oxide may each have a thickness of about 1-20 angstroms in embodiments, and a thickness of 1-4 angstroms in further embodiments. The stack 248 of alternating layers of the rare earth metal-containing oxide 242 and the second oxide or other ceramic 228 may have a total thickness of about 5 nm to about 3 µm. The thin layers of the second oxide or other ceramic 246 between the layers 242 of the rare earth metal-containing oxide may prevent crystal formation in the rare earth metal-containing oxide layers. This may enable an amorphous yttria layer to be grown.

In the embodiments described with reference to FIGS. 2A-2D, the surface reactions (e.g., half-reactions) are done sequentially, and the various precursors and reactants are not in contact in embodiments. Prior to introduction of a new precursor or reactant, the chamber in which the ALD process takes place may be purged with an inert carrier gas (such as nitrogen or air) to remove any unreacted precursor and/or surface-precursor reaction byproducts. The precursors will be different for each layer and the second precursor for the yttrium-containing oxide layer or other rare-earth metal-containing oxide layer may be a mixture of two rare earth metal-containing oxide precursors to facilitate co-deposition of these compounds to form a single phase material layer. In some embodiments, at least two precursors are used, in other embodiments at least three precursors are used and in yet further embodiments at least four precursors are used.

ALD processes may be conducted at various temperatures depending on the type of process. The optimal temperature range for a particular ALD process is referred to as the "ALD temperature window." Temperatures below the ALD temperature window may result in poor growth rates and non-ALD type deposition. Temperatures above the ALD temperature window may result in reactions taken place via a chemical vapor deposition (CVD) mechanism. The ALD temperature window may range from about 100° C. to about 400° C. In some embodiments, the ALD temperature window is between about 120° C. to about 300° C. Some ALD processes may also be performed at temperatures of about 20° C. to about 400° C.

The ALD process allows for a conformal plasma resistant coating having uniform thickness on articles and surfaces having complex geometric shapes, holes with high aspect ratios (e.g., pores), and three-dimensional structures. Sufficient exposure time of each precursor to the surface enables the precursor to disperse and fully react with the surfaces in their entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without the need for a lengthy and difficult fabrication of source materials (such as powder feedstock and sintered targets). In some embodiments ALD is used to coat articles aspect ratios of about 3:1 to 300:1.

With the ALD techniques described herein, multi-component films such as $Y_xAl_yO_z$ (e.g., $Y_3Al_5O_{12}$), $Y_xZr_yO_z$, and $Y_aZr_xAl_yO_z$, $Y_xEr_yO_z$, $Y_xEr_yF_z$, or $Y_wEr_xO_yF_z$ can be grown, deposited or co-deposited, for example, by proper mixtures of the precursors used to grow the rare-earth metal-containing oxides alone or in combination with one or more other oxides as described above and in more detail in the examples below.

Figure 3A:
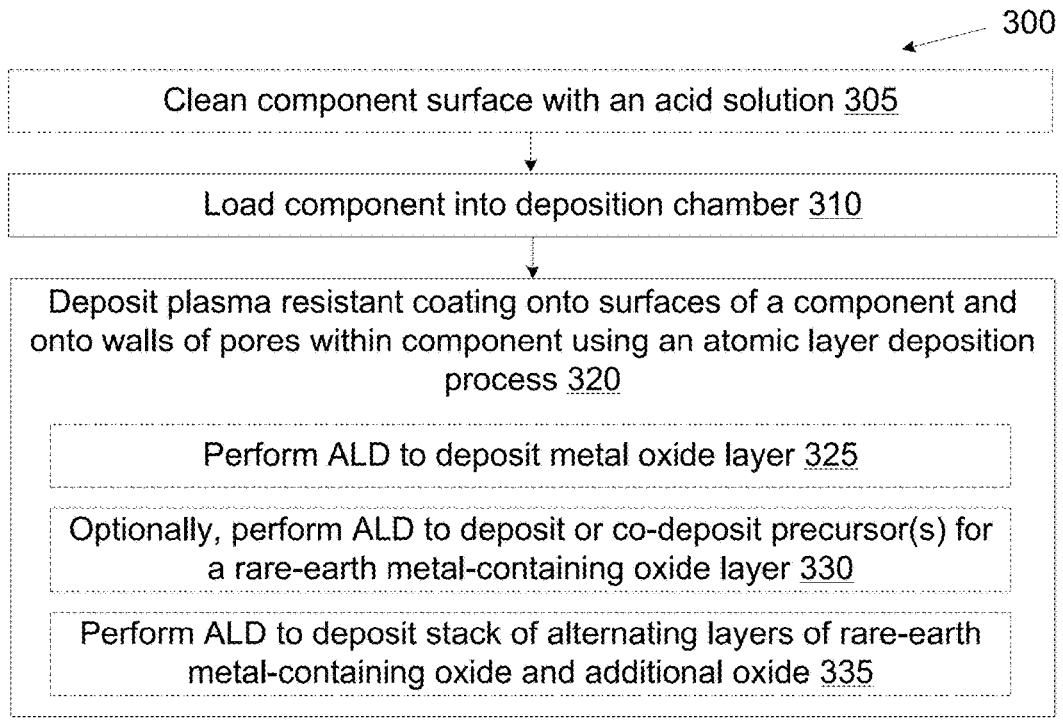
FIG. 3A illustrates a method for creating a plasma resistant coating using atomic layer deposition as described herein.

FIG. 3A illustrates a method 300 for forming a plasma resistant coating on pore walls within a porous article such as a porous process chamber component (e.g., a plug for an ESC) according to embodiments. Method 300 may be used to coat any articles described herein. The method may optionally begin by selecting a composition for the plasma resistant coating. The composition selection and method of forming may be performed by the same entity or by multiple entities.

The method may optionally include, at block 305, cleaning the article with an acid solution. In one embodiment, the article is bathed in a bath of the acid solution. The acid solution may be a hydrofluoric acid (HF) solution, a hydrochloric acid (HCl) solution, a nitric acid ($HNO_3$) solution, or combination thereof in embodiments. The acid solution may remove surface contaminants from the article and/or may remove an oxide from the surface of the article. Cleaning the article with the acid solution may improve a quality of a coating deposited using ALD. In one embodiment, an acid solution containing about 0.1 vol % to about 5.0 vol % HF is used to clean chamber components made of quartz. In one embodiment, an acid solution containing about 0.1 vol % to about 20 vol % HCl is used to clean articles made of $Al_2O_3$. In one embodiment, an acid solution containing about 5 to about 15 vol % $HNO_3$ is used to clean articles made of aluminum and other metals.

At block 310, the article is loaded into an ALD deposition chamber. At block 320, the method comprises depositing a plasma resistant coating onto a surface of the article using ALD. The plasma resistant coating is additionally deposited onto pore walls of pores within the article. In one embodiment, at block 325 ALD is performed to deposit a metal oxide layer such as an $Al_2O_3$ layer. In one embodiment, at block 330 ALD is optionally performed to deposit or co-deposit a rare-earth metal-containing oxide layer alone or together with one or more other oxides. ALD is a very conformal process as performed in embodiments, which may cause the surface roughness of the plasma resistant coating to match a surface roughness of an underlying surface of the article that is coated. The plasma resistant coating may have a total thickness of about 5 nm to about 3 µm in some embodiments. The plasma resistant coating may have a porosity of about 0% in embodiments, or may be porosity-free in embodiments, and may have a thickness variation of about +/−5% or less, +/−10% or less, or +/−20% or less.

In one embodiment, at block 335 ALD is performed to deposit a stack of alternating layers of a rare-earth metal containing oxide and an additional oxide. The additional oxide may be any of the oxides described herein. Alternatively, a single layer may be formed.

In some instances it may be beneficial to reduce the porosity and/or permeability of the porous article. The thickness of the plasma resistant coating on the pore walls of the pores may have an effect on a porosity and permeability of the porous material in some embodiments. Characterization may be performed that maps coating thickness to porosity reduction and/or to permeability reduction. The characterization may then be used to reduce an initial porosity and/or an initial permeability of the porous article to a target porosity and/or permeability. For example, a first coating thickness may reduce porosity from 60% to 50% and a second coating thickness may reduce the porosity from 60% to 40%. A starting and target porosity (or starting and target permeability) may be determined. A coating thickness that will reduce the starting porosity (or starting permeability) to the target porosity (or target permeability) may then be determined. The plasma resistant coating may then be deposited to the target thickness to cause the porosity and/or permeability to achieve the target porosity and/or target permeability.

A yttrium-containing oxide layer includes a yttrium-containing oxide and may include one or more additional rare earth metal oxides. Rare earth metal-containing oxide materials that include yttrium may be used to form the plasma resistant coating in embodiments because yttrium-containing oxides generally have high stability, high hardness, and superior erosion resistant properties. For example, $Y_2O_3$ is one of the most stable oxides and has a standard Gibbs free energy of formation)($\Delta G_f^\circ$) of −1816.65 kJ/mol, indicating the reactions of $Y_2O_3$ with most of the process chemicals are thermodynamically unfavorable under standard conditions. Plasma resistant coatings that include a first metal oxide layer and rare-earth metal-containing oxide layer with $Y_2O_3$ deposited in accordance with embodiments herein may also have a low erosion rate to many plasma and chemistry environments, such as an erosion rate of about 0 µm/hr when exposed to a direct $NF_3$ plasma chemistry at a bias of 200 Watts and 500° C. For example, a 1 hour test of direct $NF_3$ plasma at 200 Watts and 500° C. caused no measureable erosion. Examples of yttrium-containing oxide compounds that the plasma resistant coating may be formed of include $Y_2O_3$, $Y_xAl_yO_z$ (e.g., $Y_3Al_5O_{12}$), $Y_xZr_yO_z$, $Y_aZr_xAl_yO_z$, or $Y_xEr_yO_z$. The yttrium content in the plasma resistant coating may range from about 0.1 at. % to close to 100 at. %. For yttrium-containing oxides, the yttrium content may range from about 0.1 at. % to close to 100 at. % and the oxygen content may range from about 0.1 at. % to close to 100 at. %.

Examples of erbium-containing oxide compounds that the plasma resistant coating may be formed of include $Er_2O_3$, $Er_xAl_yO_z$ (e.g., $Er_3Al_5O_{12}$), $Er_xZr_yO_z$, $Er_aZr_xAl_yO_z$, $Y_xEr_yO_z$, and $Er_aY_xZr_yO_z$ (e.g., a single phase solid solution of $Y_2O_3$, $ZrO_2$ and $Er_2O_3$). The erbium content in the plasma resistant coating may range from about 0.1 at. % to close to 100 at. %. For erbium-containing oxides, the erbium content may range from about 0.1 at. % to close to 100 at. % and the oxygen content may range from about 0.1 at. % to close to 100 at. %.

Advantageously, $Y_2O_3$ and $Er_2O_3$ are miscible. A single phase solid solution can be formed for any combination of $Y_2O_3$ and $Er_2O_3$. For example, a mixture of just over 0 mol % $Er_2O_3$ and just under 100 mol % $Y_2O_3$ may be combined and co-deposited to form a plasma resistant coating that is a single phase solid solution. Additionally, a mixture of just over 0 mol % $E_2O_3$ and just under 100 mol % $Y_2O_3$ may be combined to form a plasma resistant coating that is a single phase solid solution. Plasma resistant coatings of $Y_xEr_yO_z$ may contain between over 0 mol % to under 100 mol % $Y_2O_3$ and over 0 mol % to under 100 mol % $Er_2O_3$. Some notable examples include 90-99 mol % $Y_2O_3$ and 1-10 mol % $Er_2O_3$, 80-89 mol % $Y_2O_3$ and 11-20 mol % $Er_2O_3$, 70-79 mol % $Y_2O_3$ and 21-30 mol % $Er_2O_3$, 60-69 mol % $Y_2O_3$ and 31-40 mol % $Er_2O_3$, 50-59 mol % $Y_2O_3$ and 41-50 mol % $Er_2O_3$, 40-49 mol % $Y_2O_3$ and 51-60 mol % $Er_2O_3$, 30-39 mol % $Y_2O_3$ and 61-70 mol % $Er_2O_3$, 20-29 mol % $Y_2O_3$ and 71-80 mol % $Er_2O_3$, 10-19 mol % $Y_2O_3$ and 81-90 mol % $Er_2O_3$, and 1-10 mol % $Y_2O_3$ and 90-99 mol % $Er_2O_3$. The single phase solid solution of $Y_xEr_yO_z$ may have a monoclinic cubic state at temperatures below about 2330° C.

Advantageously, $ZrO_2$ may be combined with $Y_2O_3$ and $Er_2O_3$ to form a single phase solid solution containing a mixture of the $ZrO_2$, $Y_2O_3$ and $Er_2O_3$ (e.g., $Er_aY_xZr_yO_z$). The solid solution of $Y_aEr_xZr_yO_z$ may have a cubic, hexagonal, tetragonal and/or cubic fluorite structure. The solid solution of $Y_aEr_xZr_yO_z$ may contain over 0 mol % to 60 mol % $ZrO_2$, over 0 mol % to 99 mol % $Er_2O_3$, and over 0 mol % to 99 mol % $Y_2O_3$. Some notable amounts of $ZrO_2$ that may be used include 2 mol %, 5 mol %, 10 mol %, 15 mol %, 20 mol %, 30 mol %, 50 mol % and 60 mol %. Some notable amounts of $Er_2O_3$ and/or $Y_2O_3$ that may be used include 10 mol %, 20 mol %, 30 mol %, 40 mol %, 50 mol %, 60 mol %, 70 mol %, 80 mol %, and 90 mol %.

Plasma resistant coatings of $Y_aZr_xAl_yO_z$ may contain over 0% to 60 mol % $ZrO_2$, over 0 mol % to 99 mol % $Y_2O_3$, and over 0 mol % to 60 mol % $Al_2O_3$. Some notable amounts of $ZrO_2$ that may be used include 2 mol %, 5 mol %, 10 mol %, 15 mol %, 20 mol %, 30 mol %, 50 mol % and 60 mol %. Some notable amounts of $Y_2O_3$ that may be used include 10 mol %, 20 mol %, 30 mol %, 40 mol %, 50 mol %, 60 mol %, 70 mol %, 80 mol %, and 90 mol %. Some notable amounts of $Al_2O_3$ that may be used include 2 mol %, 5 mol %, 10 mol %, 20 mol %, 30 mol %, 40 mol %, 50 mol % and 60 mol %. In one example, the plasma resistant coating of $Y_aZr_xAl_yO_z$ contains 42 mol % $Y_2O_3$, 40 mol % $ZrO_2$ and 18 mol % $Y_2O_3$ and has a lamellar structure. In another example, the plasma resistant coating of $Y_aZr_xAl_yO_z$ contains 63 mol % $Y_2O_3$, 10 mol % $ZrO_2$ and 27 mol % $Er_2O_3$ and has a lamellar structure.

In embodiments, a plasma resistant coating that includes the surface layer and the rare-earth metal-containing oxide layer of $Y_2O_3$, $Y_xAl_yO_z$ (e.g., $Y_3Al_5O_{12}$), $Y_xZr_yO_z$, $Y_aZr_xAl_yO_z$, or $Y_xEr_yO_z$ has a low outgassing rate, a dielectric breakdown voltage on the order of about 1000 V/μm, a hermiticity (leak rate) of less than about 1E-8 Torr/s, a Vickers hardness of about 600 to about 950 or about 685, an adhesion of about 75 mN to about 100 mN or about 85 mN as measured by the scratch test and a film stress of about −1000 to −2000 MPa (e.g., about −1140 MPa) as measured by x-ray diffraction at room temperature.

In some embodiments, the plasma resistant coating may be formed from an aluminum oxide precursor selected from diethylaluminum ethoxide, tris(ethylmethylamido)aluminum, aluminum sec-butoxide, aluminum tribromide, aluminum trichloride, triethylaluminum, triisobutylaluminum, trimethylaluminum, or tris(diethylamido)aluminum for ALD.

In some embodiments, the plasma resistant coating is or includes yttria, and the yttrium oxide precursor used to form the rare-earth metal-containing oxide layer may be selected from or include tris(N,N-bis(trimethylsilyl)amide)yttrium (III) or yttrium (III)butoxide for the ALD.

In some embodiments the plasma resistant coating includes zirconium oxide. When the plasma resistant coating comprises zirconium oxide, a zirconium oxide precursor may include zirconium (IV) bromide, zirconium (IV) chloride, zirconium (IV) tert-butoxide, tetrakis(diethylamido)zirconium (IV), tetrakis(dimethylamido)zirconium (IV), or tetrakis(ethylmethylamido)zirconium (IV) for ALD. One or more of these zirconium oxide precursors may be co-deposited with a yttrium oxide precursor.

In some embodiments, the plasma resistant coating may further include an erbium oxide. An erbium oxide precursor may be selected from tris-methylcyclopentadienyl erbium (III) ($Er(MeCp)_3$), erbium boranamide ($Er(BA)_3$), $Er(T-MHD)_3$, erbium(III)tris(2,2,6,6-tetramethyl-3,5-heptanedionate), or tris(butylcyclopentadienyl)erbium(III) for ALD.

Figure 3B:
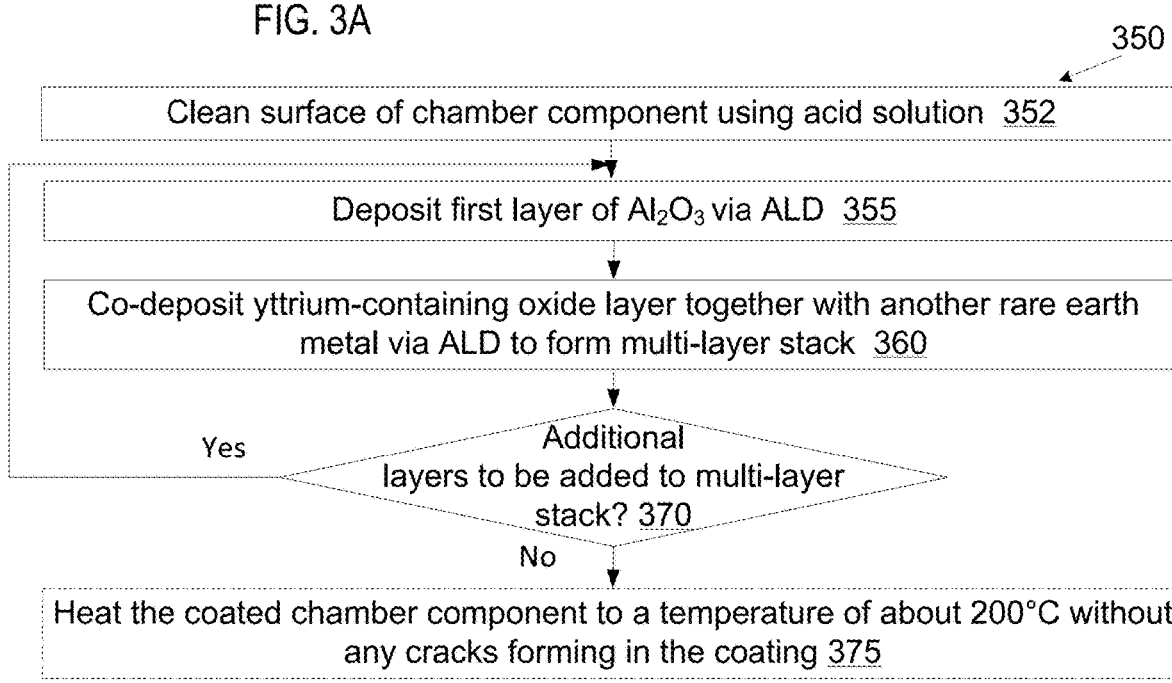
FIG. 3B illustrates a method for creating a plasma resistant coating using atomic layer deposition as described herein.

FIG. 3B illustrates a method 350 for forming a plasma resistant coating on a porous ceramic article (e.g., a porous ceramic plug for an ESC) according to an embodiment. The method may optionally begin by selecting compositions for the plasma resistant coating. The composition selection and method of forming may be performed by the same entity or by multiple entities.

At block 352 of method 350, a surface of the article (e.g., of the porous ESC plug) is cleaned using an acid solution. The acid solution may be any of the acid solutions described above with reference to block 305 of method 300. The article may then be loaded into an ALD deposition chamber.

Pursuant to block 355, the method comprises depositing a first layer of amorphous HP—$Al_2O_3$ onto surfaces of the article via ALD (including on pore walls of pores within the article). The amorphous HP—$Al_2O_3$ may have a thickness of about 5 nm to about 300 nm. Pursuant to block 360, the method further comprises forming a second layer by co-depositing (i.e., in one step) a mixture of a yttrium-containing oxide precursor and another oxide precursor onto the amorphous HP—$Al_2O_3$ surface layer via ALD. The second layer may include $Y_2O_3$ in a single phase with $Al_2O_3$ or $Er_2O_3$ or $ZrO_2$, for example. Alternatively, the second layer may include multiple phases, such as a phase of $Y_4Al_2O_9$ and another phase comprising a solid-solution of $Y_2O_3$—$ZrO_2$.

As discussed above, the rare-earth metal-containing oxide layer may include a mixture of multiple different oxides. To form such a rare-earth metal-containing oxide layer, any combination of the aforementioned yttria precursors, erbium oxide precursors, alumina precursors and/or zirconium oxide precursors may be introduced together into an ALD deposition chamber to co-deposit the various oxides and form a layer having a single phase or multiple phases. The ALD deposition or co-deposition may be performed in the presence of ozone, water, O-radicals, or other precursors that may function as oxygen donors.

At block 370, a determination may be made as to whether additional layers are to be added (e.g., if a multi-layer stack is to be formed). If additional layers are to be added, then the method may return to block 355 and an additional layer of $Al_2O_3$ may be formed. Otherwise the method may proceed to block 375.

At block 375, the article (e.g., the chamber component) and both layers of the plasma resistant coating on the chamber component are heated. The heating may be via an annealing process, a thermal cycling process and/or via a manufacturing step during semiconductor processing. In one embodiment, the thermal cycling process is performed on coupons as a check after manufacture to detect cracks for quality control, where the coupons are cycled to the highest temperature that a part may experience during processing. The thermal cycling temperature depends on a specific application or applications that the part will be used for. For a ceramic ESC plug, for example (shown in FIGS. 4A-4C), coupons may be cycled between room temperature and 250° C. The temperature may be selected based on the material of construction of the article, surface, and film layers so as to maintain their integrity and refrain from deforming, decomposing, or melting any or all of these components.

FIGS. 4A-4C depict a coated porous ceramic plug 405 for an ESC according to an embodiment. FIG. 4A illustrates a porous ceramic plug 405 for an ESC. The porous ceramic plug 405 may be made from a ceramic material such as AlO/SiO, AlO/MgO/SiO, SiC, SiN, AlN/SiO and the like. The ceramic plug 405 is just an example porous ceramic chamber component whose performance may be improved by the use of the plasma resistant coating as set forth in embodiments herein. It is to be understood that the performance of other porous, ceramic chamber components may also be improved when coated with the plasma resistant coating disclosed herein. The plug 405, as depicted here, was chosen as an illustration of a semiconductor process chamber component having a surface with complex geometry and holes (i.e., pores) with high aspect ratios. Ceramic plug 405 may be exposed to corrosive chemistries such as fluorine and when not coated with a plasma resistant coating erodes due to plasma interaction with the plug.

The ceramic plug 405 has a plurality of pores, one of which 408 is shown in FIG. 4B. The ceramic plug 405 may have a porosity of about 5% to about 60%. Pores 408 (and/or channels through the ceramic plug 405 formed by the pores) may have a high aspect ratio defined as the ratio of the length to diameter (L:D), where the high aspect ratio may range from about 3:1 to about 300:1, or about 50:1 to about 100:1. A surface 415 of pore 408 has a plasma resistant coating 420, which may correspond to any of the plasma resistant coatings described herein above. The plasma resistant coating 420 may comprise a HP—$Al_2O_3$ material or the like on the surface 415 of pore 408, which may be amorphous in embodiments. The purity of the HP—$Al_2O_3$ layer may be from about 89.99% to about 99.99% in some embodiments. The single-layer coating 420 has little or no impact on the flow path 412 through pore 408 such that even with the single-layer coating 420, the pore 408 is permeable to He gas during its normal operation. The plasma resistant coating 420 is grown or deposited on exterior surfaces of the ceramic plug 405 as well as on pore walls 415 of pores 408 within the ceramic plug 405 using the ALD technique.

The ALD technique enables a conformal coating of relatively uniform thickness and zero porosity (i.e., porosity-free) on the pore walls 415 of pore 408 despite the complex geometry and the large aspect ratios of the pores. The plasma resistant coating 420 may reduce plasma interactions and improve the plug's durability without impacting its performance. The plasma resistant coating 420 deposited with ALD maintains the relative shape and geometric configuration of the pore 408 and of the external surfaces of ceramic plug 405 so as to not disturb its functionality. Similarly, when applied to other porous ceramic chamber components, the plasma resistant coating may maintain the shape and geometric configuration of a component's surfaces and pore walls so as to not disrupt the component's functionality. The coating may also provide plasma resistance and improve erosion and/or corrosion resistance to the interior of porous articles.

The resistance of the plasma resistant coating 420 to plasma is measured through "etch rate" (ER), which may have units of micron/hour (μm/hr), throughout the duration of the coated components' operation and exposure to plasma. Measurements may be taken after different processing times. For example, measurements may be taken before processing, or at about 50 processing hours, or at about 150 processing hours, or at about 200 processing hours, and so on. Variations in the composition of the plasma resistant coating grown or deposited on the ESC plug or on any other process chamber component may result in multiple different plasma resistances or erosion rate values. Additionally, a plasma resistant coating 420 with a single composition exposed to various plasmas could have multiple different plasma resistances or erosion rate values. For example, a plasma resistant material may have a first plasma resistance or erosion rate associated with a first type of plasma and a second plasma resistance or erosion rate associated with a second type of plasma.

In some embodiments, the plasma resistant coating 420 may comprise a first layer and optionally a second rare-earth metal-containing oxide layer on top of the first layer (not shown). The first layer may comprise HP—$Al_2O_3$ and when a rare-earth metal-containing oxide layer is present, the first layer may comprise an amorphous HP—$Al_2O_3$ layer. The rare earth metal-containing oxide layer may comprise a yttrium oxide alone or together with an additional rare earth metal oxide (e.g., erbium oxide, zirconium oxide, etc.). The rare earth metal-containing oxide layer may have any rare earth metal-containing oxide material such as those described herein above. Each layer may be coated using an ALD process. The ALD process may grow conformal coating layers of uniform thickness that are porosity-free throughout the pore walls of each pore 408 despite its high aspect ratio and despite the pore walls being inside of the ceramic plug 405 while ensuring that the final multi-component coating may also be thin enough so as to not plug the pores in the ceramic plug.

FIG. 4C illustrates a substrate support assembly 422 that includes multiple porous ceramic plugs 405, 435 that have been coated with a plasma resistant coating in accordance with embodiments described herein. The substrate support assembly 422 includes a mounting plate 465, an insulation plate 460, a facilities plate 458, and an electrostatic chuck comprised of a thermally conductive base 455 and an electrostatic puck 430 bonded to the thermally conductive base 455 by a bond 450 such as a silicone bond. An o-ring 445 may be placed around the bond 450 at the periphery of the thermally conductive base 455 and electrostatic puck 430 to protect the bond 450. The insulation plate 460 may be, for example rexolite or another plastic, and may provide electrical isolation from underneath grounded hardware (e.g., from the mounting plate 465). The substrate support assembly 422 may include one or more holes that penetrate the electrostatic puck 430, bond 450, thermally conductive base 455, facilities plate 458, insulation plate 460 and/or mounting plate 465. One or multiple porous ceramic plugs 435, 405 may be inserted into the holes to prevent corrosive gases and plasma from entering the through hole. A plasma resistant coating coats pore walls of pores within ceramic plugs 405, 435 that are inserted into the one or more holes.

The mounting plate 465 includes passages for routing utilities (e.g., fluids, power lines, sensor leads, etc.) to the thermally conductive base 460 and the electrostatic puck 455.

The electrostatic puck 455 may further include multiple gas passages such as grooves, mesas and other surface features that may be formed in an upper surface of the electrostatic puck 430. The gas passages may be fluidly coupled to a source of a heat transfer (or backside) gas such as He via the aforementioned holes. In operation, the backside gas may be provided at controlled pressure into the gas passages to enhance the heat transfer between the electrostatic puck 430 and a supported substrate. As stated above, the holes may be He via holes that are plugged by porous ceramic plugs 405, 435 that are permeable to the He. The porous ceramic plugs may also be at least partially permeable to corrosive gases and plasmas that are used to clean the semiconductor processing chamber 430. The porous ceramic plugs may filter gas particles of the corrosive gases and prevent such corrosive gases from penetrating into the substrate support assembly. The porous ceramic plugs 405, 435 may additionally prevent a secondary plasma from forming within the holes in the substrate support assembly 422.

The electrostatic puck 430 includes at least one clamping electrode 440. The clamping electrode 440 (or other electrode disposed in the electrostatic puck 430) may further be coupled to one or more RF power sources through a matching circuit for maintaining a plasma formed from process and/or other gases within a processing chamber. The plasma resistant coatings on the porous ceramic plugs 405, 435 provide corrosion resistance to the plasma during processing.

The following examples are set forth to assist in understanding the embodiments described herein and should not be construed as specifically limiting the embodiments described and claimed herein. Such variations, including the substitution of all equivalents now known or later developed, which would be within the purview of those skilled in the art, and changes in formulation or minor changes in experimental design, are to be considered to fall within the scope of the embodiments incorporated herein. These examples may be achieved by performing method 300 or method 350 described above.

Example 1—Forming a HP—$Al_2O_3$ Surface Layer on a Porous Ceramic Substrate

Figure 5A:
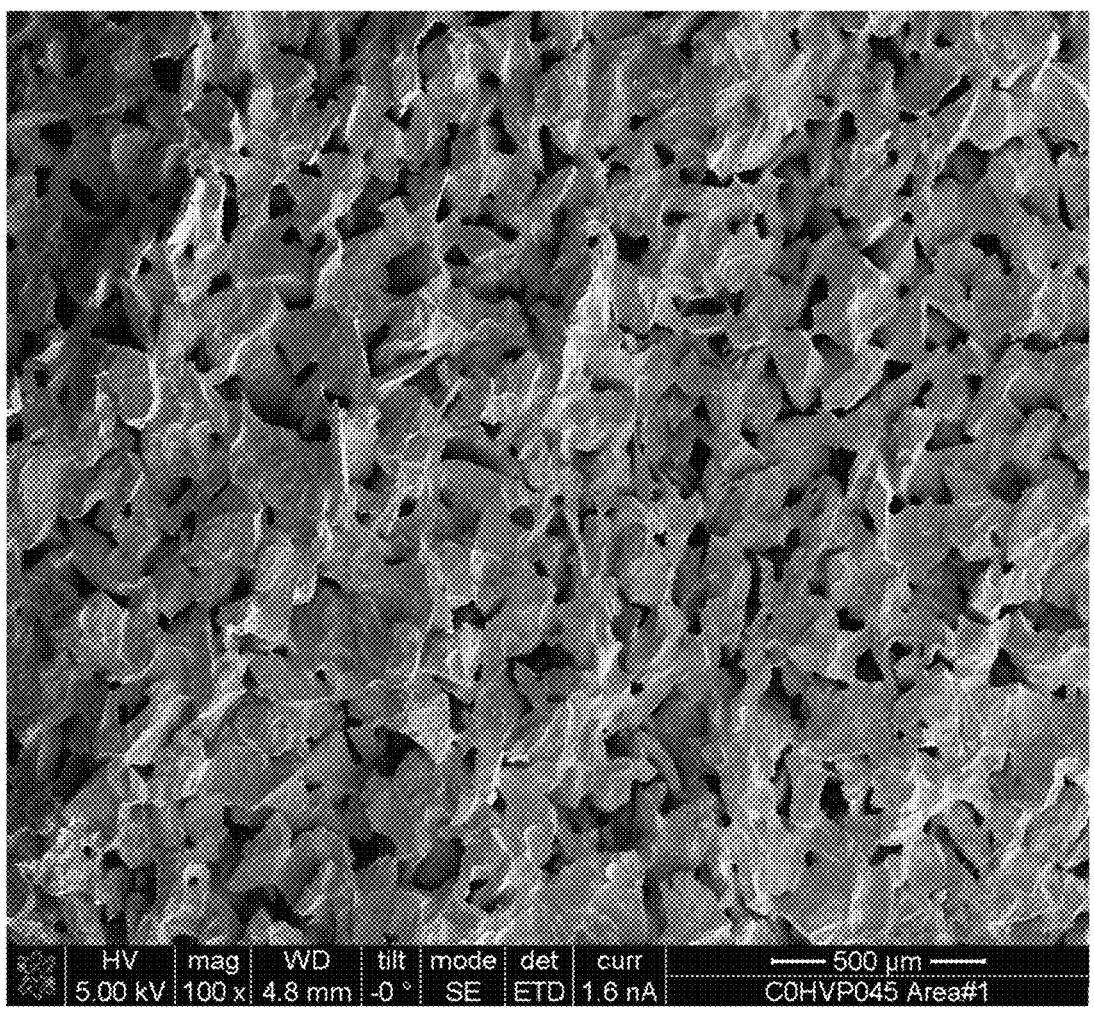
FIG. 5A is top down image showing the morphology of a porous plug coated in accordance with embodiments described herein.
Figure 5B:
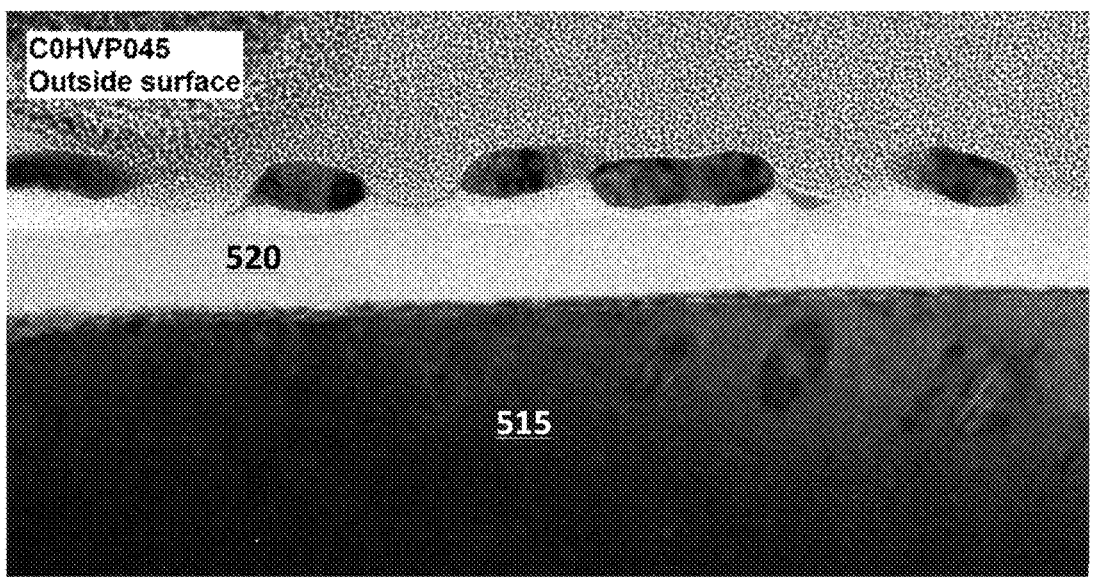
FIG. 5B is a cross sectional view of a porous plug coated in accordance with embodiments described herein.

FIG. 5A is top down image showing the morphology of a porous plug coated in accordance with embodiments described herein. FIG. 5B is a cross sectional view of a porous plug coated in accordance with embodiments described herein as imaged using transmission electron microscopy (TEM). A plasma resistant coating 520 of amorphous aluminum oxide ($Al_2O_3$) coating was deposited on a porous plug 515 comprised of alumina and silicon dioxide. The plasma resistant coating 520 of $Al_2O_3$ was deposited on the porous plug 515 using atomic layer deposition, and has a thickness of about 40 nm. The precursor for the plasma resistant coating was introduced to the substrate at a pressure on the scale of one or a few mtorr to one or a few torr and a temperature of about 100-250° C. As shown, the coating 520 does not block the pores in the porous plug 515.

Figure 6:
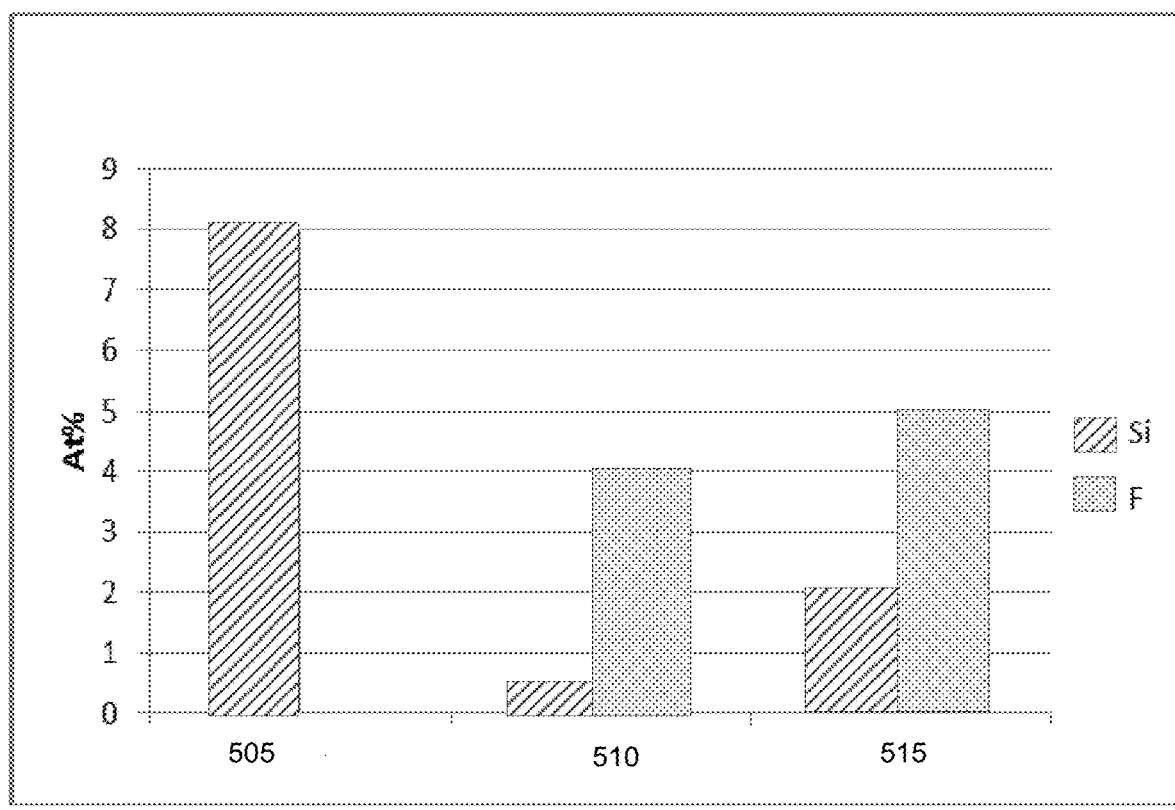
FIG. 6 is a chart showing the results of an energy dispersive x-ray microanalysis for new and used porous plugs in ceramic.

FIG. 6 shows the results of an energy dispersive x-ray microanalysis for a new porous plug 505, for a first used porous plug 510 and for a second used porous plugs 515. The results show a significant loss of silicon (Si) and high fluorine (F) content as compared to new porous plugs. Such loss of silicon and addition of fluorine is mitigated by applying a plasma resistant coating on pore walls of pores within the porous plug, as described herein.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An article comprising:
   a porous body comprising a plurality of pores within the porous body, the plurality of pores each comprising pore walls, wherein the porous body is permeable to a gas; and
   a plasma resistant coating on a surface of the porous body and on the pore walls of the plurality of pores within the porous body, the plasma resistant coating having a thickness of about 5 nm to about 3 μm and consisting essentially of a high-purity $Al_2O_3$ layer and a solid solution of $Y_2O_3$—$ZrO_2$ on the high-purity $Al_2O_3$ layer, wherein the plasma resistant coating protects the pore walls from erosion by a fluorine plasma, wherein the porous body with the plasma resistant coating remains permeable to the gas, wherein the plasma resistant coating is porosity free and has a uniform thickness having a thickness variation of less than ±20%, and wherein the article is a component for a semiconductor processing chamber.

2. The article of claim 1, wherein the solid solution of $Y_2O_3$—$ZrO_2$ consists essentially of a mixture of about 10-90 mol % $Y_2O_3$ and about 10-90 mol % $ZrO_2$.

3. The article of claim 1, wherein the solid solution of $Y_2O_3$—$ZrO_2$ consists essentially of a mixture of about 40-80 mol % $Y_2O_3$ and about 20-60 mol % $ZrO_2$.

4. The article of claim 1, wherein the solid solution of $Y_2O_3$—$ZrO_2$ consists essentially of a mixture of about 60-70 mol % $Y_2O_3$ and about 30-40 mol % $ZrO_2$.

5. The article of claim 1, wherein the article is a ceramic plug for an electrostatic chuck.

6. The article of claim 1, further comprising:
a high purity metal oxide layer adjacent to the rare earth metal containing oxide layer.

7. The article of claim 1, wherein the porous body has a porosity of about 5% to about 60%.

8. The article of claim 1, comprising:
a stack of alternating layers of a first type of layer and a second type of layer, wherein:
the first type of layer comprises a high purity metal oxide having a thickness of about 1 angstrom to about 20 angstroms; and
the second type of layer consists essentially of the solid solution of $Y_2O_3$—$ZrO_2$ and has a thickness of about 5 angstroms to about 100 angstroms.

9. The article of claim 1, wherein the porous body consists essentially of a two phase material comprising sintered particles of a first oxide and a second oxide that acts as a binder for the sintered particles of the first oxide, wherein the first oxide is selected from a group consisting of aluminum oxide and aluminum nitride and the second oxide is silicon dioxide.

10. The article of claim 1, wherein the porous body is selected from a group consisting of a) a mixture of aluminum oxide and silicon dioxide, b) a mixture of aluminum oxide, magnesium oxide and silicon dioxide, c) silicon carbide, d) silicon nitride and e) a mixture of aluminum nitride and silicon dioxide.

11. A method comprising:
performing atomic layer deposition to deposit a plasma resistant coating consisting essentially of a high-purity $Al_2O_3$ layer and a solid solution of $Y_2O_3$—$ZrO_2$ on the high-purity $Al_2O_3$ layer, wherein the plasma resistant coating is deposited on a porous chamber component comprising a plurality of pores, the plurality of pores each comprising pore walls, wherein the porous chamber component is permeable to a gas, and wherein performing the atomic layer deposition comprises:
depositing the plasma resistant coating onto a surface of the porous chamber component; and
depositing the plasma resistant coating onto the pore walls of the plurality of pores within the porous chamber component;
the plasma resistant coating having a thickness of about 5 nm to about 3 µm, wherein the plasma resistant coating protects the pore walls from erosion by a fluorine plasma, and wherein the porous chamber component with the plasma resistant coating remains permeable to the gas after performing the atomic layer deposition, wherein the plasma resistant coating is porosity free and has an about uniform thickness, and
wherein the porous chamber component is a component for a semiconductor processing chamber.

12. The method of claim 11, wherein depositing the plasma resistant coating comprises alternating deposition of $Y_2O_3$ and $ZrO_2$ to form the solid solution of $Y_2O_3$—$ZrO_2$ by:
performing a deposition cycle comprising:
injecting a yttrium-containing precursor into a deposition chamber containing the chamber component to cause the yttrium-containing precursor to adsorb onto the pore walls;
injecting an oxygen-containing reactant into the deposition chamber to cause the oxygen-containing
reactant to react with the yttrium-containing precursor and form a first layer of $Y_2O_3$;
injecting a zirconium-containing precursor into the deposition chamber to cause the zirconium-containing precursor to adsorb onto a surface of the first layer; and
injecting the oxygen-containing reactant or an alternative oxygen-containing reactant into the deposition chamber to cause the oxygen-containing reactant or the alternative oxygen-containing reactant to react with the zirconium-containing precursor and form a second layer of $ZrO_2$; and
repeating the deposition cycle one or more times until a target thickness is reached.

13. The method of claim 12, further comprising:
annealing the plasma resistant coating to cause the first layer of $Y_2O_3$ and the second layer of $ZrO_2$ to interdiffuse and form a single phase comprising the solid solution of $Y_2O_3$—$ZrO_2$.

14. The method of claim 11, wherein the porous chamber component consists essentially of a two phase material comprising sintered particles of a first oxide and a second oxide that acts as a binder for the sintered particles of the first oxide, wherein the first oxide is selected from a group consisting of aluminum oxide and aluminum nitride and the second oxide is silicon dioxide.

15. The method of claim 11, wherein the porous chamber component is a plug for an electrostatic chuck.

16. The method of claim 11, further comprising:
determining at least one of an initial porosity or an initial permeability of the porous chamber component;
determining at least one of a target porosity or a target permeability for the porous chamber component; and
determining a target thickness of the plasma resistant coating that will reduce at least one of the initial porosity to the target porosity or the initial permeability to the target permeability,
wherein the plasma resistant coating has the target thickness.

17. The method of claim 11, wherein the solid solution of $Y_2O_3$—$ZrO_2$ comprises a mixture of about 10-90 mol % $Y_2O_3$ and about 10-90 mol % $ZrO_2$.

18. The method of claim 11, wherein the solid solution of $Y_2O_3$—$ZrO_2$ comprises a mixture of about 40-80 mol % $Y_2O_3$ and about 20-60 mol % $ZrO_2$.

19. The method of claim 11, wherein the solid solution of $Y_2O_3$—$ZrO_2$ comprises a mixture of about 60-70 mol % $Y_2O_3$ and about 30-40 mol % $ZrO_2$.

20. The method of claim 11, wherein depositing the plasma resistant coating comprises codepositing $Y_2O_3$ and $ZrO_2$ to form a phase comprising the solid solution of $Y_2O_3$—$ZrO_2$ by:
performing a deposition cycle comprising:
co-injecting a mixture of a first precursor for the $Y_2O_3$ and a second precursor for the $ZrO_2$ into a deposition chamber containing the chamber component to cause the first precursor and the second precursor to adsorb onto the pore walls; and
injecting an oxygen-containing reactant into the deposition chamber to react with the first precursor and the second precursor and form the solid solution of $Y_2O_3$—$ZrO_2$; and repeating the deposition cycle one or more times until a target thickness is reached.

21. The article of claim 1, wherein the porous body consists essentially of a mixture of aluminum oxide, magnesium oxide and silicon dioxide.

22. The article of claim 1, wherein the plasma resistant coating comprises thermal resistance to cracking and delamination at temperatures up to about 350° C.

23. The article of claim 1, wherein the aluminum oxide has a purity of about 89.99% to about 99.99.

24. The article of claim 11, wherein the aluminum oxide has a purity of about 89.99% to about 99.99.

* * * * *